US012419171B2

(12) United States Patent
Wang

(10) Patent No.: US 12,419,171 B2
(45) Date of Patent: Sep. 16, 2025

(54) DISPLAY PANEL AND METHOD FOR MANUFACTURING THE SAME, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Yunhao Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/776,258

(22) PCT Filed: Jul. 29, 2021

(86) PCT No.: PCT/CN2021/109260
§ 371 (c)(1),
(2) Date: May 12, 2022

(87) PCT Pub. No.: WO2023/004684
PCT Pub. Date: Feb. 2, 2023

(65) Prior Publication Data
US 2024/0155899 A1    May 9, 2024

(51) Int. Cl.
*H10K 59/131*    (2023.01)
*H10K 50/80*    (2023.01)
(Continued)

(52) U.S. Cl.
CPC ..... *H10K 59/1315* (2023.02); *H10K 59/1201* (2023.02); *H10K 59/122* (2023.02); *H10K 71/60* (2023.02)

(58) Field of Classification Search
CPC ........... H10K 59/1315; H10K 59/1201; H10K 59/122; H10K 71/60; H10K 59/123;
(Continued)

(56) References Cited

U.S. PATENT DOCUMENTS 11,532,682 B2 *  12/2022  Han ..................... H01L 27/1248
11,647,655 B2 *   5/2023  Yun ......................... H10K 71/00
                                                                257/40
(Continued)

FOREIGN PATENT DOCUMENTS

CN    106531768 A  *  3/2017  ......... H01L 27/3244
CN    110047898 A     7/2019
(Continued)

*Primary Examiner* — Ajay Ojha
*Assistant Examiner* — Tsz K Chiu
(74) *Attorney, Agent, or Firm* — Dority & Manning, P.A.

(57) ABSTRACT

A display panel includes a substrate, a first planarization layer, a conductive pattern layer, a second planarization layer, and an anode layer that are stacked in order. A surface of the first planarization layer away from the substrate has first grooves. The conductive pattern layer includes conductive patterns. At least a portion of a conductive pattern is located in a first groove, and a surface, away from the substrate, of the at least a portion of the conductive pattern located in the first groove is substantially flush with a portion, except the first grooves, of the surface of the first planarization layer. The anode layer includes anodes. A vertical projection of the portion of the conductive pattern located in the first groove on the substrate overlaps with a vertical projection of an anode on the substrate.

17 Claims, 14 Drawing Sheets

(51) Int. Cl.
*H10K 59/12* (2023.01)
*H10K 59/122* (2023.01)
*H10K 71/60* (2023.01)

(58) Field of Classification Search
CPC ............... H10K 59/124; H10K 59/131; H10K 59/1213; H10K 59/1216; H10K 59/353; H10K 59/121; H10K 59/126; H10K 71/00; H10K 59/873; H10K 59/65; H10K 50/844; H10K 59/88; H10K 59/351; H10K 2102/311; H10K 59/352; H10K 59/12; H10K 77/111; H10K 59/40; H10K 59/80515; H10K 59/80522; H10K 59/8731; H10K 59/18; H10K 59/38; H10K 50/813; H10K 59/87; H10K 59/8722; H10K 50/824; H10K 50/84; H10K 59/8051; H10K 59/80521; H10K 59/8723; H10K 59/179; H10K 59/35; H10K 50/822; H10K 2102/351; H10K 50/82; H10K 59/10; H10K 59/805; H10K 71/70; H10K 2102/302; H10K 2102/341; H10K 50/15; H10K 50/16; H10K 50/171; H10K 50/81; H10K 50/865; H10K 59/00; H10K 59/60; H10K 59/8792; H10K 2101/40; H10K 2102/103; H10K 2102/3026; H10K 50/11; H10K 50/12; H10K 50/155; H10K 50/156; H10K 50/17; H10K 50/19; H10K 50/80; H10K 50/818; H10K 50/828; H10K 50/8428; H10K 50/88; H10K 59/173; H10K 59/70; H10K 59/80; H10K 59/80516; H10K 59/80518; H10K 59/8791; H10K 77/10; H10K 85/00; H10K 2102/00; H10K 50/00; H10K 50/8426; H10K 50/8445; H10K 50/86; H10K 59/127; H10K 59/128; H10K 59/129; H10K 59/13; H10K 59/176; H10K 59/1795; H10K 59/8052; H10K 71/166; H10K 71/851
See application file for complete search history.

(56) References Cited

U.S. PATENT DOCUMENTS

| | | | |
|---|---|---|---|
| 11,742,362 B2* | 8/2023 | Rui | H01L 29/78675 257/71 |
| 11,765,953 B2* | 9/2023 | Lim | H10K 59/1213 345/204 |
| 12,010,855 B2* | 6/2024 | Kim | H10K 59/1216 |
| 12,114,546 B2* | 10/2024 | Wang | H10K 59/80517 |
| 2005/0133793 A1* | 6/2005 | Kim | H10D 30/6713 257/E29.147 |
| 2007/0216280 A1* | 9/2007 | Hara | H10K 59/12 313/463 |
| 2013/0187177 A1* | 7/2013 | Nanai | H01L 21/467 438/34 |
| 2013/0301278 A1 | 11/2013 | Choi et al. | |
| 2014/0225075 A1* | 8/2014 | Zhan | H01L 29/78672 257/66 |
| 2016/0217743 A1* | 7/2016 | Kim | H10K 19/00 |
| 2017/0141169 A1* | 5/2017 | Sim | H10K 71/00 |
| 2017/0279071 A1* | 9/2017 | Tamekawa | H10K 59/871 |
| 2018/0159076 A1* | 6/2018 | Yun | H10K 59/122 |
| 2019/0131375 A1* | 5/2019 | Kim | H10K 59/8791 |
| 2021/0083035 A1* | 3/2021 | Yun | H10K 71/00 |
| 2021/0118972 A1 | 4/2021 | Zou et al. | |
| 2021/0288294 A1 | 9/2021 | Guo et al. | |
| 2021/0328002 A1* | 10/2021 | Lee | H10K 59/80522 |
| 2021/0408477 A1* | 12/2021 | Park | H10K 50/844 |
| 2022/0293699 A1 | 9/2022 | Chen et al. | |

FOREIGN PATENT DOCUMENTS

| | | |
|---|---|---|
| CN | 110416257 A | 11/2019 |
| JP | 2010238677 A | 10/2010 |

* cited by examiner

DISPLAY PANEL AND METHOD FOR MANUFACTURING THE SAME, AND DISPLAY APPARATUS

CROSS-REFERENCE TO RELATED APPLICATION

The present application is a national phase entry under 35 USC 371 of International Patent Application No. PCT/CN2021/109260, filed on Jul. 29, 2021, which is incorporated herein by reference in its entirety.

TECHNICAL FIELD

The present disclosure relates to the field of display technologies, and in particular, to a display panel and a method for manufacturing the same, and a display apparatus.

BACKGROUND

Organic light-emitting diode (OLED) display panels have advantages of self-luminescence, wide viewing angle, high contrast, fast response speed, low power consumption, ultra-thin, etc., and thus receive wide attention.

SUMMARY

In an aspect, a display panel is provided. The display panel includes a substrate, a first planarization layer, a conductive pattern layer, a second planarization layer, and an anode layer. The first planarization layer is disposed on a side of the substrate, and a surface of the first planarization layer away from the substrate has a plurality of first grooves. The conductive pattern layer is disposed on the surface of the first planarization layer away from the substrate, and includes a plurality of conductive patterns. At least a portion of a conductive pattern is located in a first groove, and a surface, away from the substrate, of the at least a portion of the conductive pattern located in the first groove is substantially flush with a portion, except the plurality of first grooves, of the surface of the first planarization layer away from the substrate. The second planarization layer is disposed on a surface of the conductive pattern layer away from the substrate. The anode layer is disposed on a surface of the second planarization layer away from the substrate and includes a plurality of anodes. A vertical projection of the at least a portion of the conductive pattern located in the first groove on the substrate overlaps with a vertical projection of an anode on the substrate.

In some embodiments, the display panel further includes a source-drain conductive layer. The source-drain conductive layer is disposed between the substrate and the first planarization layer and includes at least one of a plurality of voltage signal lines, a plurality of data signal lines, and source-drain electrode patterns of thin film transistors. The plurality of conductive patterns include a plurality of signal lines, and at least a portion of a signal line is located in the first groove.

In some embodiments, line widths at all positions of the signal line are substantially equal. A vertical projection of the first groove on the substrate passes a vertical projection of the anode on the substrate in an extending direction of the signal line.

In some embodiments, the display panel further includes a pixel definition layer. The pixel definition layer is disposed on a side of the anode layer away from the substrate, and the pixel definition layer has a plurality of first openings. The anode includes a main body portion, and a vertical projection of a first opening on the substrate is located within a vertical projection of the main body portion on the substrate. The vertical projection of the main body portion of the anode layer on the substrate is located within a vertical projection of the first groove on the substrate.

In some embodiments, the first groove is a frame-shaped groove connected end to end, and a line width of the at least a portion of the signal line located in the first groove is less than a line width of a remaining portion of the signal line.

In some embodiments, the display panel further includes a pixel definition layer. The pixel definition layer is disposed on a side of the anode layer away from the substrate, and the pixel definition layer has a plurality of first openings. An anode includes a main body portion, and a vertical projection of a first opening on the substrate is located within a vertical projection of the main body portion on the substrate. An outer border of a vertical projection of the first groove on the substrate coincides with a border of the vertical projection of the main body portion on the substrate.

In some embodiments, the surface of the first planarization layer away from the substrate further has a plurality of second grooves, and a second groove is located between two adjacent first grooves, and communicates with the two adjacent first grooves. A portion, located between portions of the signal line located in the two adjacent first grooves, of the signal line is located in the second groove, and a surface, away from the substrate, of the portion of the signal line located in the second groove is substantially flush with a portion, except the plurality of first grooves and the plurality of second grooves, of the surface of the first planarization layer away from the substrate.

In some embodiments, the plurality of signal lines include at least one of a plurality of auxiliary data signal lines and a plurality of auxiliary voltage signal lines.

In some embodiments, the source-drain conductive layer includes at least the voltage signal lines. The voltage signal lines extend in a first direction and are arranged at intervals in a second direction. The plurality of signal lines include a plurality of auxiliary voltage signal lines, and an auxiliary voltage signal line is electrically connected to a voltage signal line. The plurality of auxiliary voltage signal lines include a plurality of first auxiliary voltage signal lines and a plurality of second auxiliary voltage signal lines. The first auxiliary voltage signal lines extend in the first direction, and are arranged at intervals in the second direction. The first planarization layer further has a plurality of first via holes, a first auxiliary voltage signal line is opposite to a voltage signal line, and the first auxiliary voltage signal line is electrically connected to the voltage signal line opposite thereto through at least one first via hole. The second auxiliary voltage signal lines extend in the second direction, and are arranged at intervals in the first direction. The plurality of second auxiliary voltage signal lines are configured to electrically connect the plurality of first auxiliary voltage signal lines.

In some embodiments, the display panel further includes a color filter layer, the color filter layer is disposed on a side of the anode layer away from the substrate, and the color filter layer includes a plurality of filter portions arranged at intervals. The surface of the first planarization layer away from the substrate further has a plurality of third grooves. The source-drain conductive layer includes at least the source-drain electrode patterns of the thin film transistors. The conductive pattern layer further includes a plurality of transition blocks, and a transition block is configured to electrically connect an anode to a source-drain electrode pattern of a thin film transistor. At least a portion of a transition block is located in a third groove, a vertical projection of the at least a portion of the transition block located in the third groove on the substrate overlaps with a vertical projection of a filter portion on the substrate, and a surface, away from the substrate, of the portion of the transition block located in the third groove is substantially flush with a portion, except the plurality of the first grooves and the third grooves, of the surface of the planarization layer away from the substrate.

In some embodiments, the transition block includes a first portion, a vertical projection of the first portion of the transition block on the substrate is located within the vertical projection of the filter portion on the substrate, and at least a portion of the first portion of the transition block is located in the third groove.

In some embodiments, the transition block is located in the third groove.

In some embodiments, the anode includes a main body portion and a connection portion connected to the main body portion. The second planarization layer further has a plurality of third via holes, and the connection portion is electrically connected to the transition block through at least one third via hole. The first planarization layer further has a plurality of second via holes, and the transition block is electrically connected to the source-drain electrode pattern through at least one second via hole.

In some embodiments, a depth of the third groove is in a range of 0.6 μm to 0.7 μm, inclusive.

In some embodiments, a thickness of the first planarization layer is within a range of 1.5 μm to 3.0 μm. A depth of the third groove is in a range of 0.6 μm to 0.7 μm, inclusive.

In some embodiments, the plurality of conductive patterns include at least source-drain electrode patterns of thin film transistors.

The source-drain electrode patterns of the plurality of thin film transistors include a first source-drain electrode pattern, a vertical projection of the first source-drain electrode pattern on the substrate overlaps with a vertical projection of an anode on the substrate. The first source-drain electrode pattern includes a second portion, a vertical projection of the second portion on the substrate is located within the vertical projection of the anode on the substrate, and the second portion is located in a first groove.

In some embodiments, the first source-drain electrode pattern further includes a third portion, and a vertical projection of the third portion on the substrate is located outside the vertical projection of the anode on the substrate. The second portion and the third portion of the first source-drain electrode pattern are located in the first groove.

In some embodiments, the plurality of conductive patterns further include a plurality of voltage signal lines and a plurality of data signal lines, and a portion, whose vertical projection on the substrate overlapping with the vertical projection of the anode on the substrate, of each of at least one of the plurality of voltage signal lines and the plurality of data signal lines is located in the first groove.

In some embodiments, the plurality of conductive patterns further include a plurality of voltage signal lines and a plurality of data signal lines, and each of at least one of the plurality of voltage signal lines and the plurality of data signal lines is located in the first groove.

In some embodiments, the display panel further includes an active layer, a first gate conductive layer and a second gate conductive layer. The active layer is disposed between the substrate and the first planarization layer and includes active layer patterns of the thin film transistors. The first gate conductive layer is disposed between the active layer and the first planarization layer and includes gate patterns of the thin film transistors. The second gate conductive layer is disposed between the first gate conductive layer and the first planarization layer. A capacitor is composed of a portion of the second gate conductive layer and a portion of the first gate conductive layer. A surface of the first planarization layer proximate to the substrate is in direct contact with the second gate conductive layer.

In some embodiments, a material of the first planarization layer includes an organic material.

In another aspect, a display apparatus is provided. The display apparatus includes the display panel as described in any of the above embodiments.

In yet another aspect, a method for manufacturing a display panel is provided. The method includes: forming an insulating material film on a side of a substrate; forming a plurality of first grooves in the insulating material film to form a first planarization layer; forming a conductive pattern layer on a surface of the first planarization layer away from the substrate; forming a second planarization layer on a surface of the conductive pattern layer away from the substrate; and forming an anode layer on a surface of the second planarization layer away from the substrate. The conductive pattern layer includes a plurality of conductive patterns, at least a portion of a conductive pattern is located in a first groove, and a surface, away from the substrate, of the at least a portion of the conductive pattern located in the first groove is substantially flush with a portion, except the plurality of first grooves, of the surface of the first planarization layer away from the substrate. The anode layer includes a plurality of anodes, and a vertical projection of the portion of the conductive pattern located in the first groove on the substrate overlaps with a vertical projection of an anode on the substrate.

In some embodiments, the plurality of conductive patterns include a plurality of auxiliary voltage signal lines and a plurality of transition blocks. Before forming the insulating material film on the side of the substrate, the method further includes: forming a source-drain conductive layer on the substrate. The source-drain conductive layer includes a plurality of voltage signal lines, a plurality of data signal lines, and source-drain electrode patterns of thin film transistors.

While the plurality of first grooves are formed in the insulating material film, the method further includes: forming a plurality of first via holes and a plurality of second via holes in the insulating material film. An end of a first via hole proximate to the substrate exposes a portion of a voltage signal line, and a portion of an auxiliary voltage signal line is located in at least one first via hole, and is electrically connected to the voltage signal line. An end of a second via hole proximate to the substrate exposes a portion of a source-drain electrode pattern, and a portion of a transition block is located in at least one second via hole, and is electrically connected to the source-drain electrode pattern of the thin film transistor.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
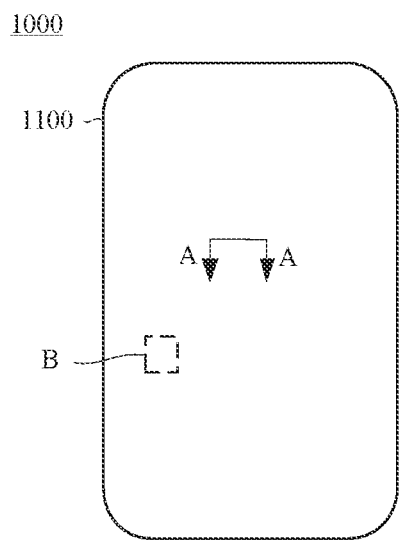
FIG. 1 is a schematic diagram of a display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The use of the phrase "configured to" herein means an open and inclusive expression, which does not exclude devices that are applicable to or configured to perform additional tasks or steps.

Additionally, the use of the phase "based on" is meant to be open and inclusive, since a process, step, calculation or other action that is "based on" one or more of the stated conditions or values may, in practice, be based on additional conditions or value beyond those stated.

The term "substantially" or "approximately" as used herein includes a stated value and an average value within an acceptable range of deviation of a particular value determined by a person of ordinary skill in the art, considering measurement in question and the error associated with measurement of a particular quantity (i.e., limitations of a measurement system).

The term such as "parallel", "perpendicular" or "equal" as used herein includes a stated condition and a condition similar to the stated condition. A range of the similar condition is within an acceptable range of deviation of a particular value. The acceptable range of deviation is determined by a person of ordinary skill in the art in view of measurement in question and the error associated with measurement of a particular quantity (i.e., limitations of a measurement system). For example, the term "parallel" includes absolute parallelism and approximate parallelism, and an acceptable range of deviation of approximate parallelism may be, for example, a deviation within 5°; the term "perpendicular" includes absolute perpendicularity and approximate perpendicularity, and an acceptable range of deviation of approximate perpendicularity may also be, for example, a deviation within 5°; the term "equal" includes absolute equality and approximate equality, and an acceptable range of deviation of approximate equality may be, for example, a difference between two equals of less than or equal to 5% of either.

Herein, "the vertical projection of A overlapping the vertical projection of B" includes "the vertical projection of A completely overlapping the vertical projection of B" and "the vertical projection of A partially overlapping the vertical projection of B". "The vertical projection of A completely overlapping the vertical projection of B" means that a border of the vertical projection of A substantially coincide with a border of the vertical projection of B. "The vertical projection of A partially overlapping the vertical projection of B" means that, the vertical projection of A coincides with a part of the vertical projection of B, and the vertical projection of A is separated from a part of the vertical projection of B; or, the border of the vertical projection of A is located within the border of the vertical projection of B; or, the border of the vertical projection of B is located within the border of the vertical projection of A.

Exemplary embodiments are described herein with reference to sectional views and/or plan views as idealized exemplary drawings. In the accompanying drawings, thickness of layers and sizes of regions are enlarged for clarity. Variations in shape with respect to the accompanying drawings due to, for example, manufacturing techniques and/or tolerances may be envisaged. Therefore, the exemplary embodiments should not be construed as being limited to the shapes of the regions shown herein, but including shape deviations due to, for example, manufacturing. For example, an etched region shown as a rectangle generally has a feature of being curved. Therefore, the regions shown in the accompanying drawings are schematic in nature, and their shapes are not intended to show actual shapes of regions in a device, and are not intended to limit the scope of the exemplary embodiments.

Some embodiments of the present disclosure provide a display apparatus 1000, referring to FIG. 1, FIG. 1 is a diagram showing a structure of the display apparatus. The display apparatus 1000 may be a television, a notebook computer, a tablet computer, a mobile phone, a personal digital assistant (PDA), a navigator, a wearable device, an augmented reality (AR) device, a virtual reality (VR) device or any other products or components having a display function.

The display apparatus 1000 may be an electroluminescent display apparatus or a photoluminescent display apparatus. In a case where the display apparatus 1000 is an electroluminescent display apparatus, the electroluminescent display apparatus may be an organic light-emitting diode display apparatus or a quantum dot light-emitting diode (QLED) display apparatus. In a case where the display apparatus 1000 is a photoluminescent display apparatus, the photoluminescent display apparatus may be a quantum dot photoluminescent display apparatus.

Figure 2A:
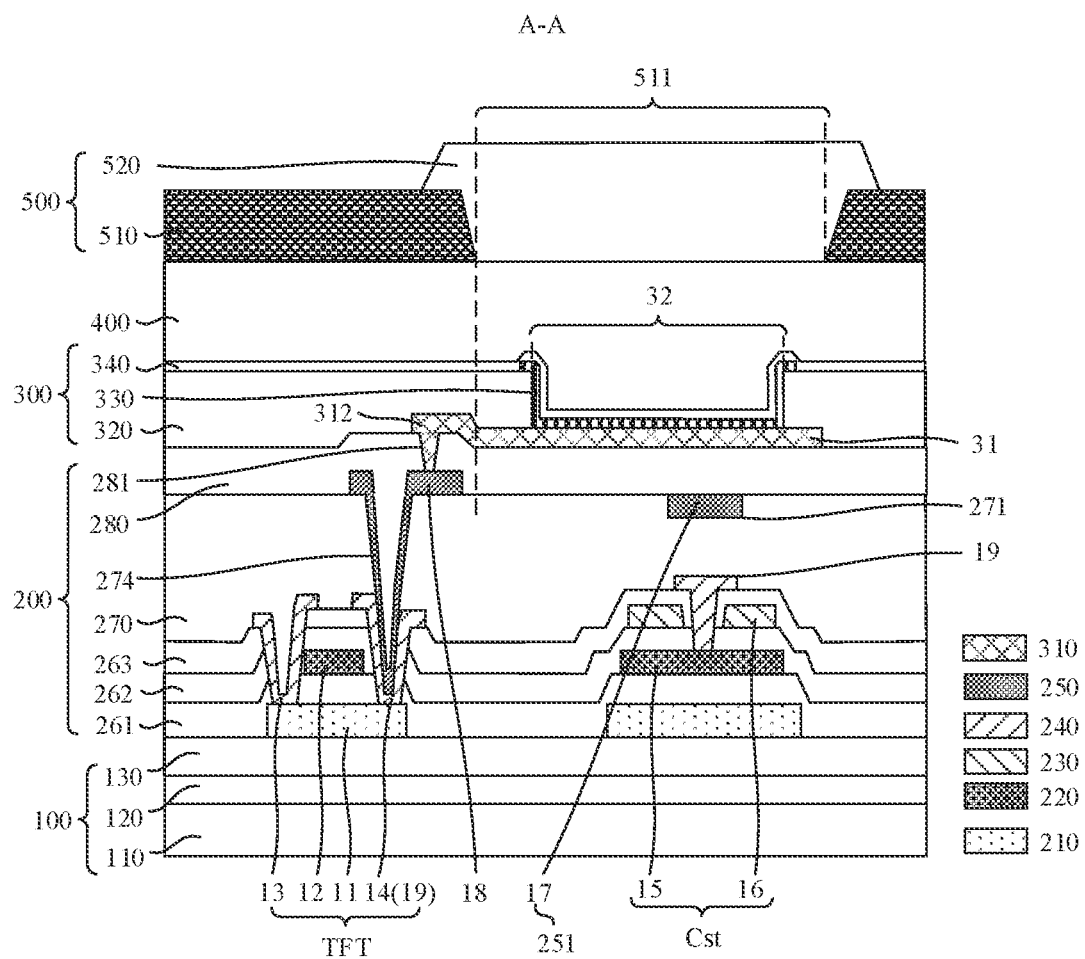
FIG. 2A is a sectional view taken along the section line A-A in FIG. 1.

Referring to FIG. 1, the display apparatus 1000 includes a display panel 1100. Referring to FIG. 2A, FIG. 2A is a sectional view of the display panel 1100 in FIG. 1 taken along the section line A-A. The display panel 1100 includes a pixel circuit layer 200, a light-emitting device 300 and an encapsulation layer 400 that are stacked on a substrate 100.

The substrate 100 may be a flexible substrate. For example, the substrate 100 is made of resin, in this case, the display panel 1100 may be a flexible display panel (which can be bent or folded). Alternatively, the substrate 100 may be a rigid substrate. For example, the substrate 100 is a glass substrate, in this case, the display panel 1100 may be a rigid display panel (which cannot be bent and folded).

The substrate 100 may be of a composite film structure in which a plurality of film layer structures are stacked. For example, considering an example where the substrate 100 is a rigid substrate, referring to FIG. 2A, the substrate 100 includes a glass base 110, a resin layer 120 and a buffer layer 130 that are stacked.

The pixel circuit layer 200 refers to a film layer where a plurality of pixel circuit arranged in an array are located. Each pixel circuit in the pixel circuit layer 200 is configured to control a light-emitting device 300 electrically connected to the pixel circuit to emit light. The pixel circuit may include a plurality of switching devices and at least one capacitor.

For example, the switching device may be a thin film transistor (TFT) or a field effect transistor (FET). The embodiments of the present disclosure are described by taking an example where the switching device is a thin film transistor, that is, the pixel circuit includes a plurality of thin film transistors (FIG. 2A only exemplarily shows a single thin film transistor that is electrically connected to the light-emitting device 300). The thin film transistor may be a P-type transistor or an N-type transistor. The P-type transistor is turned on due to the action of a low potential, and is turned off due to the action of a high potential. The N-type transistor is turned on due to the action of a high potential, and is turned off due to the action of a low potential.

The pixel circuit layer 200 includes a plurality of patterned conductive layers that are stacked. Hereinafter, the structures of the patterned conductive layers are exemplified.

In some embodiments of the present disclosure, as shown in FIG. 2A, the plurality of patterned conductive layers include an active layer 210, a first gate conductive layer 220, a second gate conductive layer 230, a source-drain conductive layer 240 and a conductive pattern layer 250 that are stacked. In this case, the thin film transistor includes an active layer pattern 11 located in the active layer 210, a gate pattern 12 located in the first gate conductive layer 220, a source 13 and a drain 14 located in the source-drain conductive layer 240. The capacitor Cst includes a first electrode plate 15 located in the first gate conductive layer 220 and a second electrode plate 16 located in the second gate conductive layer 230.

Figure 2B:
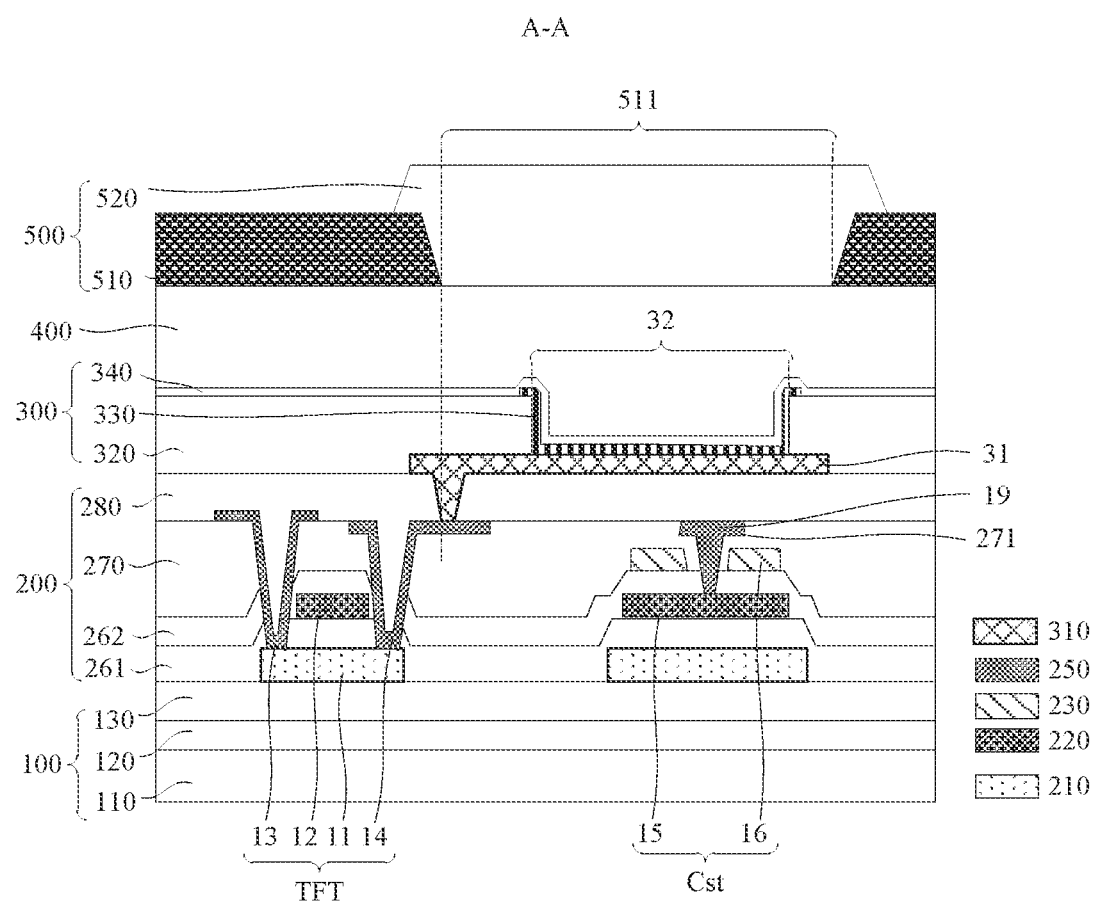
FIG. 2B is another sectional view taken along the section line A-A in FIG. 1.

Alternatively, in some other embodiments of the present disclosure, as shown in FIG. 2B, the plurality of patterned conductive layers include an active layer 210, a first gate conductive layer 220, a second gate conductive layer 230, a source-drain conductive layer 240 and a conductive pattern layer 250 that are stacked. In this case, the thin film transistor includes an active layer pattern 11 located in the active layer 210, a gate pattern 12 located in the first gate conductive layer 220, a source 13 and a drain 14 located in the conductive pattern layer 250. The capacitor Cst includes a first electrode plate 15 located in the first gate conductive layer 220 and a second electrode plate 16 located in the second gate conductive layer 230.

In the embodiments of the present disclosure, among the plurality of patterned conductive layers, a patterned conductive layer farthest from the substrate 100 is the conductive pattern layer 250. In this way, the conductive pattern layer 250 may refer to different film layers in different embodiments.

For example, in the embodiments shown in FIG. 2A, the source-drain conductive layer 240 is configured to arrange signal lines of the pixel circuit and source-drain patterns of the thin film transistors. The conductive pattern layer 250 is configured to arrange auxiliary signal lines of the pixel circuit, and the auxiliary signal line is configured to be electrically connected to the signal line, so that the auxiliary signal line and the signal line are connected in parallel to reduce a resistance of the signal line. For example, in the embodiments shown in FIG. 2B, the conductive pattern layer 250 is configured to arrange lines of the pixel circuit and source-drain patterns of the thin film transistors.

The pixel circuit layer 200 further includes an insulating layer disposed between every two adjacent patterned conductive layers, and two planarization layers located on two sides of the conductive pattern layer 250 (two opposite sides along a thickness direction of the conductive pattern layer 250). A material of the insulating layer includes an inorganic material. During a manufacturing process of the display panel, the insulating layer may be manufactured through vapor deposition, so that a thickness of the formed insulating layer is substantially uniform, and a surface of the insulating layer undulates with an undulation of a surface of a base on which it is located. The material of the planarization layer includes an organic material. During a manufacturing process of the display panel, the planarization layer may be manufactured through a coating process, thereby forming a planarization layer having a substantially flat surface. The organic material of the planarization layer is also an electrically insulating material. In this way, a planarization layer located on a side of the conductive pattern layer 250 proximate to the substrate 100 may further serve as an insulating layer between the conductive pattern layer 250 and a patterned conductive layer adjacent to the conductive pattern layer 250, which is beneficial to reduce the number of film layers of the display panel 100 and make the display panel 1100 light and thin.

Since each patterned conductive layer is provided with different conductive patterns, and the insulating layer is usually of a film layer structure with a uniform thickness, a surface of a film layer in the pixel circuit layer 200 proximate to the planarization layer has an undulation (being uneven).

During the manufacturing process of the display panel 1100, the planarization layer is manufactured through the coating process, and a surface of the planarization layer away from the substrate 100 undulates with an undulation of the surface of a base on which it is located due to a viscous effect of the material of the planarization layer. An undulation degree of the planarization layer is less than an undulation degree of the surface of the substrate where the planarization layer is located. The surface of the substrate where the planarization layer is located refers to a surface located on a side of the planarization layer proximate to the substrate and in direct contact with the planarization layer.

For example, referring to FIG. 2A, in a case where the plurality of patterned conductive layers include the active layer 210, the first gate conductive layer 220, the second gate conductive layer 230, the source-drain conductive layer 240 and the conductive pattern layer 250 that are stacked, the pixel circuit layer 200 further includes a first gate insulating layer 261 located between the active layer 210 and the first gate conductive layer 220, a second gate insulating layer 262 located between the first gate conductive layer 220 and the second gate conductive layer 230, an interlayer dielectric layer 263 located between the second gate conductive layer 230 and the source-drain conductive layer 240, a first planarization layer 270 located between the source-drain conductive layer 240 and the conductive pattern layer 250, and a second planarization layer 280 located on a side of the conductive pattern layer 250 away from the substrate 100.

In this way, a surface of the first planarization layer 270 away from the substrate 100 undulates with an undulation of a surface away from the substrate 100 of a whole formed by the interlayer dielectric layer 263 and the source-drain conductive layer 240. A surface of the second planarization layer 280 away from the substrate 100 undulates with an undulation of a surface away from the substrate 100 of a whole formed by first planarization layer 270 and the conductive pattern layer 250.

For example, referring to FIG. 2B, in a case where the plurality of patterned conductive layers include the active layer 210, the first gate conductive layer 220, the second gate conductive layer 230 and the conductive pattern layer 250 that are stacked, the pixel circuit layer 200 further includes the first gate insulating layer 261 located between the active layer 210 and the first gate conductive layer 220, the second gate insulating layer 262 located between the first gate conductive layer 220 and the second gate conductive layer 230, the first planarization layer 270 located between the second gate conductive layer 230 and the conductive pattern layer 250, and the second planarization layer 280 located on the side of the conductive pattern layer 250 away from the substrate 100.

In this way, the surface of the first planarization layer 270 away from the substrate 100 undulates with an undulation of a surface away from the substrate 100 of a whole formed by second gate insulating layer 262 and the second gate conductive layer 230. A surface of the second planarization layer 280 away from the substrate 100 undulates with an undulation of a surface away from the substrate 100 of a whole formed by first planarization layer 270 and the conductive pattern layer 250.

The light-emitting device 300 is disposed on a side of the pixel circuit layer 200 away from the substrate 100. In some embodiments, referring to FIGS. 2A, 2B, 5, 7, 9 and 11, the light-emitting device 300 includes an anode layer 310, a pixel definition layer 320, a light-emitting functional layer 330 and a cathode layer 340 that are stacked.

The anode layer 310 includes a plurality of anodes 31 separated from each other (FIG. 2A only exemplarily shows a single anode 31). The pixel definition layer 320 has a plurality of first openings 32. Each first opening 32 is opposite to an anode 31, and a border of a vertical projection of the first opening 32 on the substrate 100 is located within a border of a vertical projection of an anode 31 opposite thereto on the substrate 100. Each first opening 32 defines an effective light-emitting region of a sub-pixel. At least a portion of the light-emitting functional layer 330 is located in the first opening 32. The cathode layer 340 is disposed on a side of the light-emitting functional layer 330 away from the substrate 100. For example, the cathode layer 340 may be of a whole-layer film structure.

In some embodiments, the light-emitting functional layer 330 includes a light-emitting layer. In some other embodiments, in addition to the light-emitting layer, the light-emitting functional layer 330 further includes at least one of an electron transport layer (ETL), an electron injection layer (EIL), a hole transport layer (HTL), and a hole injection layer (HIL).

During the manufacturing process of the display panel 1100, the anode layer 310 is manufactured through a sputtering process, so that a thickness of the formed anode 31 is uniform. Based on this, a surface of the anode 31 away from the substrate 100 undulates with an undulation of a surface of a base on which the anode 31 is located.

For example, the anode layer 310 is directly disposed on the surface of the second planarization layer 280, and the anode 31 included in the anode layer 320 undulates with an undulation of a surface of a region of the second planarization layer 280 on which the anode 31 is located. That is, in a case where a surface of the region of the second planarization layer 280 that is configured to arrange the anode 31 has an undulation, the anode 31 located on the region also has an undulation adapted to the above undulation. In a case where the surface of the region of the second planarization layer 280 that is configured to arrange the anode 31 is a flat surface, the anode 31 located on the region is also flat.

The encapsulation layer 400 may be an encapsulation film or an encapsulation substrate, which is not limited in the embodiments of the present disclosure.

In some embodiments, referring to FIGS. 2A, 2B, 5, 7, 9 and 11, the display panel 1100 further includes a color filter layer 500 disposed on a side of the encapsulation layer 400 away from the substrate 100. The color filter layer 500 includes a black matrix 510 and a plurality of filter portions 520. The black matrix 510 has a plurality of second openings 511, and at least part of a filter portion 520 is located in a second opening 511.

A first opening 32 is opposite to a second opening 511, and a border of a vertical projection of the first opening 32 on the substrate 100 is located within a border of a vertical projection of a second opening 511 that is opposite to the first opening 32 on the substrate 100, so that light emitted by a light-emitting device 300 may exit passing through the filter portion 520 in the second opening 511.

The filter portion 520 is configured to color the light emitted by the light-emitting device 300. For example, the filter portions 520 may include red filter portions 520, green filter portions 520, and blue filter portions 520.

The black matrix 510 of the color filter layer 500 may reduce reflection of the display panel 1100 to the ambient light. Based on this, compared with a case of reducing the reflection of the display panel 1100 to the ambient light by providing a polarizer, in a case where the display panel 1100 includes the color filter layer 500, the display apparatus 1000 may be provided with one less polarizer, so that the display apparatus 1000 is lighter and thinner, and the manufacturing cost of the display apparatus 1000 is reduced.

In the related art, in a pixel circuit layer, a surface, away from the substrate, of a film layer proximate to a planarization layer has an undulation, resulting in an undulation on the surface of the planarization layer away from the substrate. An anode layer is directly provided on the planarization layer, so that a surface of an anode included in the anode layer may also have an undulation. Moreover, by replacing a polarizer with a color filter layer, the display panel achieves a function of reducing the reflection to the ambient light, so that ambient light incident on the anode layer may exit passing through a filter portion at an opening of a black matrix after being reflected by the anode layer. Since a surface of the anode layer has an undulation, a color breakup phenomenon will occur on light reflected by the anode layer, that is, the light reflected by the anode layer will form a color halo, and moreover, the greater the undulation degree of the anode layer is (the worse the flatness is), the more serious the color breakup phenomenon of the light reflected by the anode layer may be, and the more obvious the color halo may be. After the light subjected to the color breakup exits from the filter portion, a color halo may be formed on the light exit surface of the display panel. Especially, when the display panel is in a dark state (no image information is displayed), the color halo formed on the display panel may be more obvious, and is easy to cause dazzling.

Some embodiments of the present disclosure provide the display panel 1100, referring to FIGS. 2A and 2B, a surface of the first planarization layer 270 away from the substrate 100 has a plurality of first grooves 271 (FIG. 2A only exemplarily shows a single first groove 271). A depth of the first groove 271 is less than a thickness of the first planarization layer 270, so that the first groove 271 has a bottom wall that is substantially parallel to a plane where the substrate 100 is located, thereby preventing patterned conductive layers located on two sides of the first planarization layer 270 from being electrically connected through the first groove 271. The depth of the first groove 271 refers to a dimension of the first groove 271 in a thickness direction of the substrate 100 (a vertical direction in FIG. 2A). The thickness of the first planarization layer 270 refers to a dimension of the first planarization layer 270 in the thickness direction of the substrate 100.

A vertical projection of an anode 31 on the substrate 100 overlaps with a vertical projection of at least one first groove 271 on the substrate 100. For example, the vertical projection of the anode 31 on the substrate 100 overlaps with a vertical projection of a single first groove 271 on the substrate 100.

It will be noted that the vertical projection of the first groove 271 on the substrate 100 overlapping with the vertical projection of the anode 31 on the substrate includes two cases, one of which is that the vertical projections of the two (the first groove 271 and the anode 31) on the substrate 100 completely overlap, and another of which is that the vertical projections of the two on the substrate 100 partially overlap.

The vertical projections of the two on the substrate 100 completely overlapping means that borders of the vertical projections of the two on the substrate 100 substantially coincide. The vertical projections of the two on the substrate 100 partially overlapping means that, part of the vertical projections of the two on the substrate 100 coincide with each other, and part of the vertical projections are separated from each other (do not coinciding); alternatively, a border of the vertical projection of one of the two on the substrate 100 is located within a border of the vertical projection of the other of the two on the substrate 100, and at least part of the borders of the vertical projections of the two on the substrate 100 do not coincide.

As shown in FIG. 2A, the conductive pattern layer 250 is located between the first planarization layer 270 and the second planarization layer 280, and includes a plurality of conductive patterns 251. At least portions of the plurality of conductive patterns 251 are located in the first grooves 271, so that each first groove 271 is filled with at least a portion of a conductive pattern 251. A surface, away from the substrate 100, of the at least a portion of the conductive pattern 251 located in the first groove 271 is substantially flush with a portion, except the plurality of first grooves 271, of the surface of the first planarization layer 270 away from the substrate 100. As a result, the flatness of a surface of a whole formed by the first planarization layer 270 and the conductive pattern 251 located in the first groove 271 may be improved, and the flatness of a surface of a base where the second planarization layer 280 is located may be improved.

The surface, away from the substrate 100, of the at least a portion of the conductive pattern 251 located in the first groove 271 being substantially flush with the portion, except the plurality of first grooves 271, of the surface of the first planarization layer 270 away from the substrate 100 means that, a thickness of the at least a portion of the conductive pattern 251 located in the first groove 271 is substantially equal to the depth of the first groove 271.

Due to the limitation of precision of the manufacturing process and the error of the measurement system, during the actual manufacturing process, it is difficult to make the depth of the first groove 271 and the thickness of the portion of the conductive pattern 251 absolutely equal. In the embodiments of the present disclosure, the thickness of the portion of the conductive pattern 251 located in the first groove 271 being approximately equal to the depth of the first groove 271 means that, a difference between the thickness of the conductive pattern 251 (the portion located in the first groove 271) and the depth of the first groove 271 is within an acceptable deviation range. For example, the above acceptable deviation range may be 5%. That is, a ratio of the difference between the thickness of the conductive pattern 251 and the depth of the first groove 271 to a preset value is less than or equal to 5% of the preset value. The preset value is a design value of the thickness of the conductive pattern 251 or the depth of the first groove 271. Of course, the above acceptable deviation range may also be 3%, 8%, or the like, which is not limited in the embodiments of the present disclosure.

It will be understood that, since the first groove 271 is filled with at least a portion of the conductive pattern 251, the border of the first groove 271 completely coincides with a border of the at least a portion of the conductive pattern 251 located in the first groove 271. In the figures of the present disclosure, a portion indicated by the first groove 271 is the border of the at least a portion of the conductive pattern 251 located in the first groove 271. For example, referring to FIG. 2A, the portion indicated by the first groove 271 is a border of the at least a portion of the conductive pattern 251 (a signal line 17) contacting with the first planarization layer 270.

The display panel 1100 provided by the embodiments of the present disclosure includes the first planarization layer 270, the second planarization layer 280, and the conductive pattern layer 250 located between the first planarization layer 270 and the second planarization layer 280, and the anode layer 310 disposed on the surface of the second planarization layer 280 away from the substrate 100. By arranging two planarization layers (the first planarization layer 270 and the second planarization layer 280), the flatness of the surface of the base where the second planarization layer 280 is located may be improved.

Moreover, the portion of the conductive pattern 251 is embedded in the first groove 271, and the vertical projection of the first groove 271 on the substrate 100 overlaps with the vertical projection of the anode 31 on the substrate 100. Based on this, the vertical projection of the at least a portion of the conductive pattern 251 located in the first groove 271 on the substrate 100 coincide with the vertical projection of the anode 31 on the substrate 100. That is, at least a portion of the conductive pattern 251 opposite to the anode 31 is embedded in the first groove 271. The surface of the at least a portion of the conductive pattern 251 located in the first groove 271 away from the substrate 100 is substantially flush with the portion, except the plurality of first grooves 271, of the surface of the first planarization layer 270 away from the substrate 100. In this way, a flatness of a region of the second planarization layer 280 for arranging the anode 31 may be improved, and in turn, a flatness of the anode 31 may be improved, and thus a degree of the color breakup of the ambient light reflected by the anode 31 may be reduced, a possibility of color halo formed on the light-emitting surface of the display panel 1100 may be reduced, a risk of dazzling the human eyes may be reduced, and the user experience may be improved.

Referring to FIG. 2A, in the case where the patterned conductive layers of the pixel circuit layer 200 includes the active layer 210, the first gate conductive layer 220, the second gate conductive layer 230, the source-drain conductive layer 240 and the conductive pattern layer 250 that are stacked, the source-drain conductive layer 240 is disposed between the substrate 100 and the first planarization layer 270, and is in direct contact with the first planarization layer 270.

Figure 3:
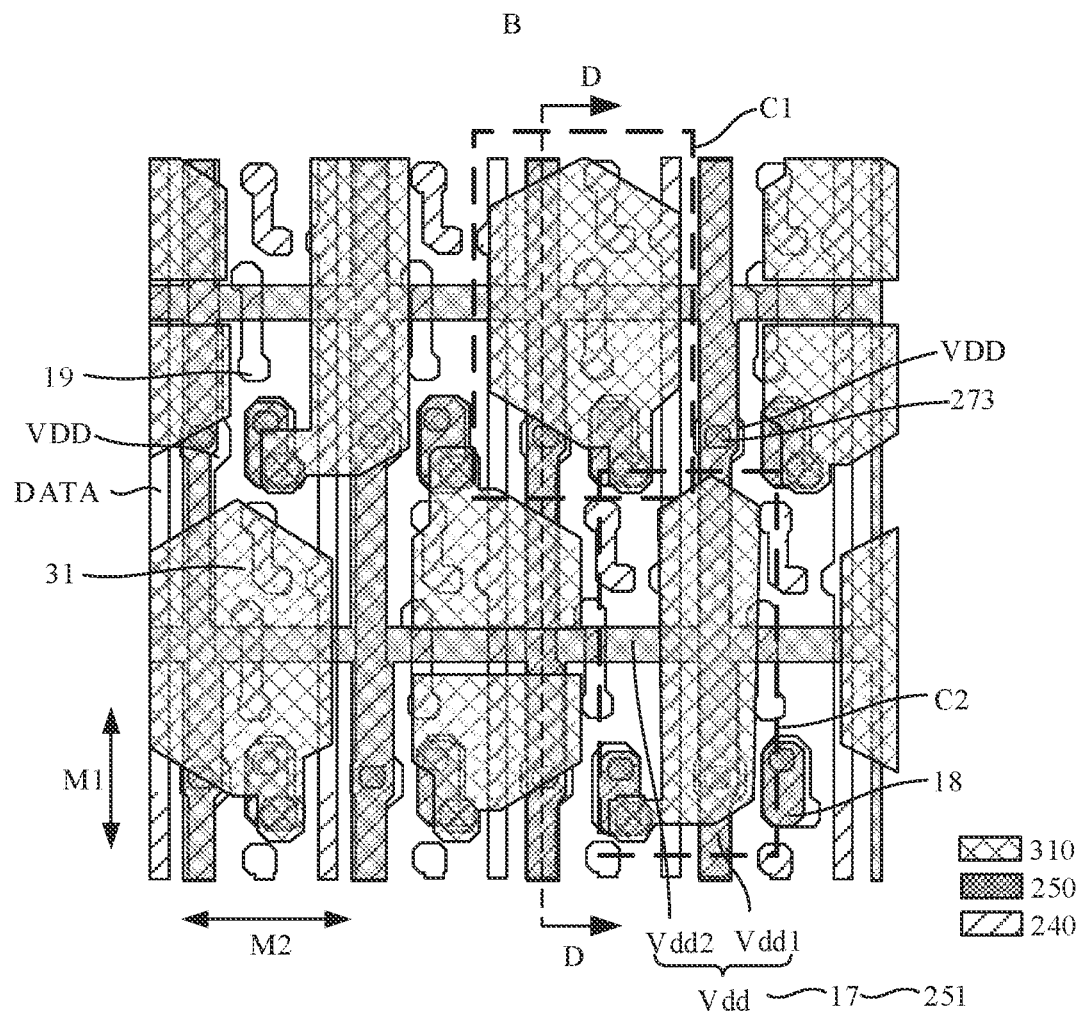
FIG. 3 is a structural diagram of a region B of a display panel in FIG. 1.

Referring to FIG. 3, FIG. 3 is a structural diagram of a region B of the display panel in FIG. 1. FIG. 3 only exemplarily shows the source-drain conductive layer 240, the conductive pattern layer 250 and the anode layer 310 of the display panel 1100. The source-drain conductive layer 240 includes at least a plurality of voltage signal lines VDD, a plurality of data signal lines DATA, and the source-drain electrode patterns 19 of the thin film transistors. The plurality of conductive patterns 251 include a plurality of signal lines 17 (signal lines Vdd in FIG. 3). At least a portion of a signal line 17 is located in a first groove 271, so that the impact of the signal lines 17 on the flatness of the second planarization layer 280 is reduced, and the flatness of the anode 31 is improved.

According to the flatness of the surface of the first planarization layer 270 away from the substrate 100, a surface of the signal line 17 away from the substrate 100 may have protrusions or depressions. That is, the surface of the signal line 17 away from the substrate 100 may not be absolutely flat. For example, a surface, away from the substrate 100, of the portion of the signal line 17 located in the first groove 271 may not be absolutely flat. For example, a surface, away from the substrate 100, of a portion of the signal line 17 located outside the first groove 271 may not be absolutely flat.

Figure 4:
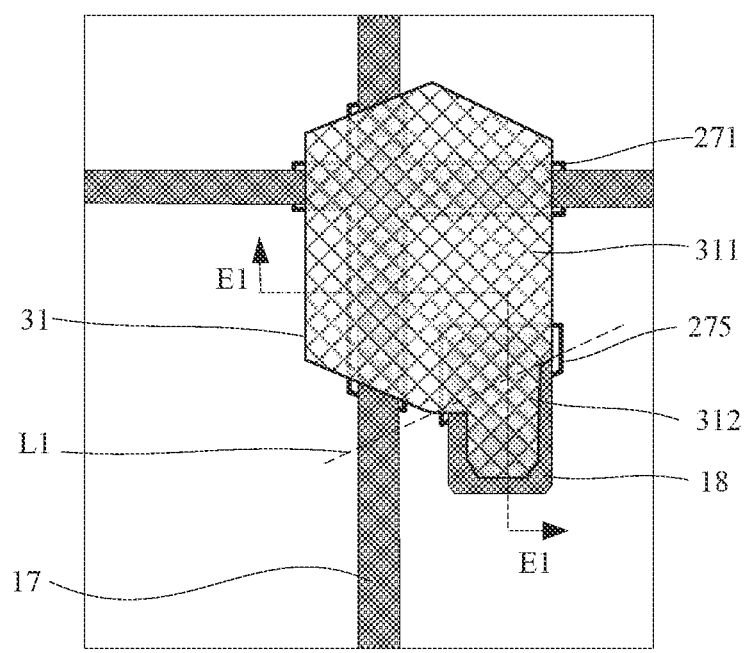
FIG. 4 is a partial enlarged view of a region C1 in FIG. 3.

In some embodiments, referring to FIG. 4, FIG. 4 is a partial enlarged view of an anode 31 in FIG. 3 (the anode 31 in a region C1 shown in FIG. 3), line widths of all portions of the signal line 17 are substantially equal. That is, a line width of the portion of the signal line 17 located in the first groove 271 is substantially equal to the line width of the portion of the signal line 17 located outside the first groove 271. In this way, changes to the line width and routing direction of the signal line 17 may be reduced, and it is beneficial to the spatial arrangement of the signal line 17. As a result, parasitic capacitance between the signal line 17 and other conductive patterns is avoided, and the resistivity of the portion of the signal line 17 located in the first groove 271 is not changed.

For example, referring to FIG. 4, an extending direction of the portion of the signal line 17 located in the first groove 271 is substantially the same as an extending direction of the portion of the signal line 17 located outside the first groove 271. In this way, it may facilitate the spatial arrangement of the plurality of signal lines 17.

It will be noted that, due to the precision of the manufacturing process and the error of the measurement system, it is difficult for the line widths of all portions of the signal lines 17 to be completely equal. "The line widths of all portions of the signal line 17 being approximately equal" in the embodiments of the present disclosure means that, a difference between line widths of any portions of the signal line 17 is within an acceptable deviation range. For example, the acceptable deviation range is 5%. That is, a ratio of a difference between an actual value and a design value of the line width of the signal line 17 to the design value is less than or equal to 5%. Of course, the acceptable deviation range may also be 2%, 7%, or the like, which is not limited in the embodiments of the present disclosure.

In the figures provided by the embodiments of the present disclosure, in order to distinguish the first groove 271 and the portion of the conductive pattern 251 located in the first groove 271, there is a gap between the border of the first groove 271 and the border of the portion of the signal line 17 located in the first groove 271. However, in actual production, the border of the portion of the signal line 17 and the border of the first groove 271 may be closely attached.

That is, the first groove 271 is filled with the portion of the signal line. For example, referring to FIG. 4, there is a gap between a border of the portion of the signal line 17 extending in an extending direction of the signal line 17 and a border of the first groove 271 extending in the extending direction of the signal line 17, while in actual production process, the border of the portion of the signal line 17 extending in the extending direction of the signal line 17 coincides with the border of the first groove 271 extending in the extending direction of the signal line 17. That is, the portion of the signal line 17 fully attaches side walls of the first groove 271.

Figure 5:
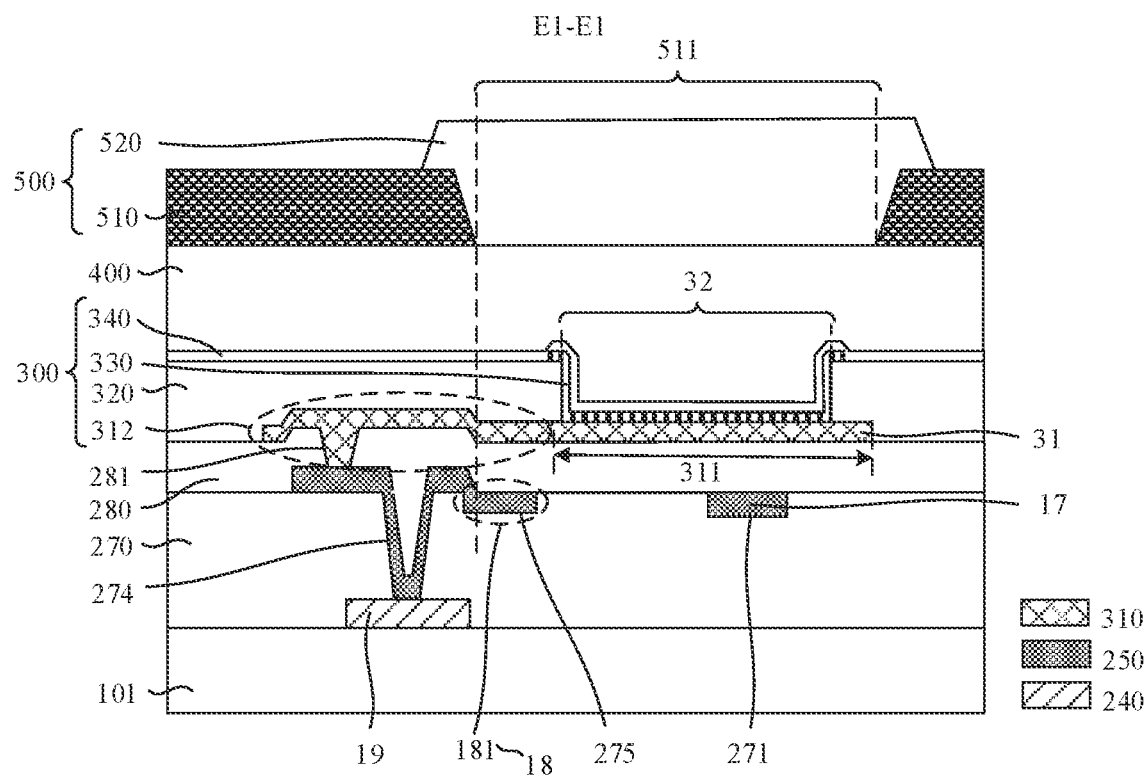
FIG. 5 is a sectional view taken along the section line E1-E1 in FIG. 4.

Referring to FIG. 5, FIG. 5 is a sectional view taken along the section line E1-E1 in FIG. 4. In FIG. 5, other film layers of the display panel 1100 are provided on the basis of the film layers shown in FIG. 4. A surface, away from the substrate 100, of the portion of the signal line 17 located in the first groove 271 is substantially flush with the portion, except the plurality of first grooves 271, of the surface of the first planarization layer 270 away from the substrate 100, which may reduce or avoid the undulation between a first region of the second planarization layer 280 and a peripheral region of the second planarization layer 280. The first region refers to a region where the second planarization layer 280 being in contact with the portion of the signal line in the first groove 271. As a result, a flatness of the surface of the base on which the region of the second planarization layer 280 configured to arrange the anode 31 is located may be improved, and in turn the flatness of the anode 31 is improved.

Referring to FIG. 4, in the extending direction of the signal line 17, a vertical projection of the first groove 271 on the substrate 100 passes a vertical projection, on the substrate 100, of an anode 31 whose vertical projection on the substrate overlapping with a vertical projection of the portion of the signal line located in the first groove on the substrate. That is, in the extending direction of the signal line 17, two ends of the vertical projection of the first groove 271 on the substrate 100 substantially coincide with the border of the vertical projection of the anode 31 on the substrate 100, or at least one end of the vertical projection of the first groove 271 on the substrate 100 exceeds the border of the vertical projection of the anode 31 on the substrate 100. In this way, the portion of the signal line 271 opposite to the anode 31 may be located completely in the first groove 271, which may further reduce the impact of the portion of the signal line 271 opposite to the anode 31 on the flatness of the anode 31. A vertical projection of the portion of the signal line 271 opposite to the anode 31 on the substrate 100 completely overlaps with the vertical projection of the anode 31 on the substrate 100.

For example, there are a plurality of signal lines 17, and a portion opposite to an anode 31 of any signal line 17 is located in a first groove 271, so that the impact of the signal line 271 on the flatness of the anode 31 may be reduced to a greater extent. As a result, the flatness of all the anodes 31 included in the anode layer 310 is improved, and the possibility of forming the color halo on the light exit surface of the display panel 1100 is reduced.

Figure 8:
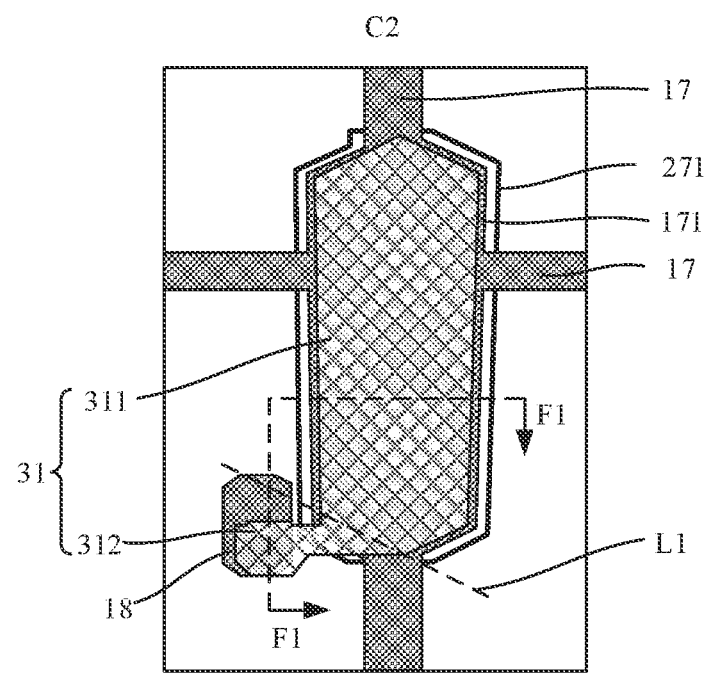
FIG. 8 is a partial enlarged view of a region C2 in FIG. 3.
Figure 9:
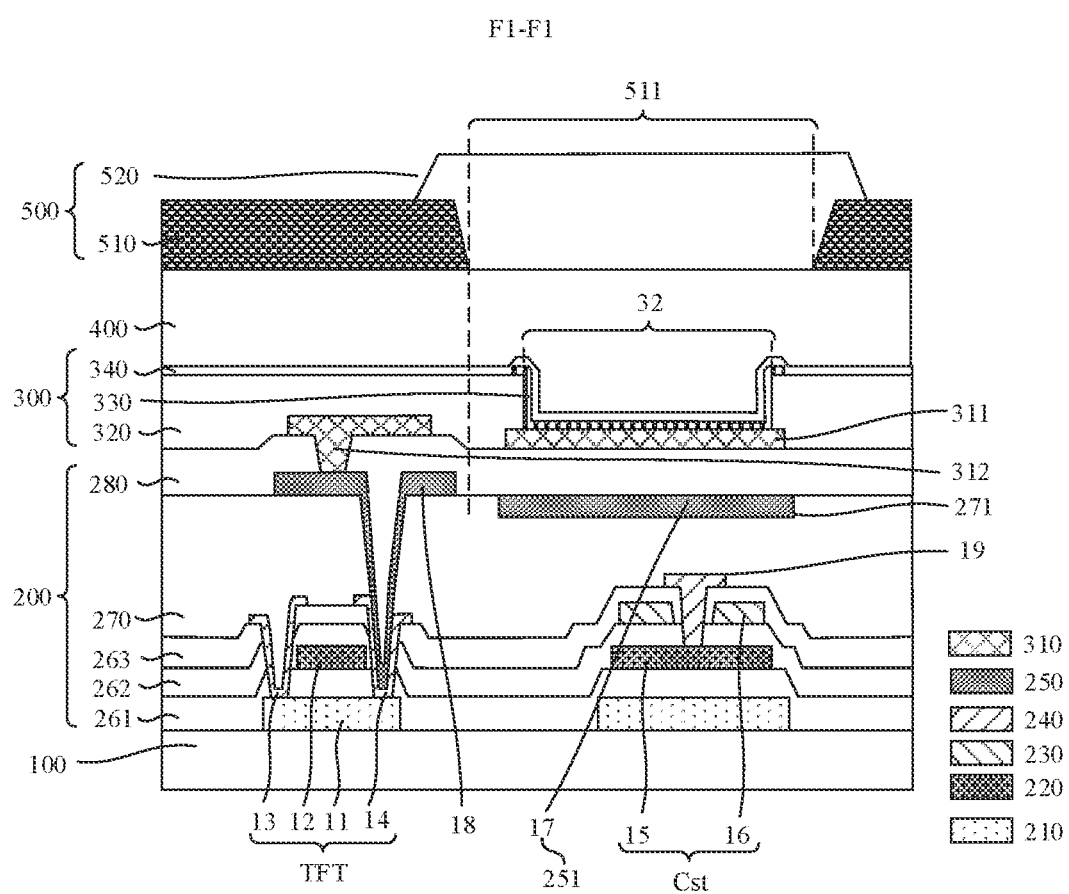
FIG. 9 is a sectional view taken along the section line F1-F1 in FIG. 8.

Referring to FIG. 8, FIG. 8 is a partial enlarged view of an anode 31 in FIG. 3 (the anode 31 in a region C2 shown in FIG. 3). The anode 31 includes a main body portion 311 and a connection portion 312 connected to the main body portion 311. As shown in FIG. 8, the anode 31 is divided into the main body portion 311 and the connection portion 312 with the dotted line L1 as a boundary. Referring to FIG. 9, FIG. 9 is a sectional view taken along the section line E1-E1 in FIG. 8. In FIG. 9, other film layers of the display panel 1100 are provided on the basis of the film layers shown in FIG. 8.

A vertical projection of a first opening 32 of the pixel definition layer 320 on the substrate 100 is located within a vertical projection of a main body portion 311 of an anode 31 opposite to the first opening 32 on the substrate 100. A connection portion 312 is electrically connected to the main body portion 311, and is configured to electrically connect the main body portion 311 to the pixel circuit, so that the pixel circuit may control the light-emitting device 300 to emit light.

Due to the manufacturing accuracy and the error of the measurement system, in the actual production process, it is difficult to make the surface, away from the substrate 100, of the portion of the signal line 17 located in the first groove 271 to completely flush with the portion, except the plurality of first grooves 271, of the surface of the first planarization layer 270 away from the substrate 100. That is, there may still has unevenness at the boundary between the portion of the signal line 17 located in the first groove 271 and the first planarization layer 270.

In some embodiments, referring to FIGS. 8 and 9, in a case where the vertical projection of the main body portion 311 of the anode 31 on the substrate 100 is separated from a vertical projection of a transition block 18 on the substrate 100, the vertical projection of the main body portion 311 of the anode 31 on the substrate 100 may be located within the vertical projection of the first groove 271 on the substrate 100. Thus, the vertical projection of the main body portion 312 on the substrate 100 is located within the vertical projection of the portion of the signal line 17 located in the first groove 271 on the substrate 100. In this way, a region on which the anode 31 is disposed of the second planarization layer 280 is completely located on the portion of the signal line 17 in the first groove 271. Therefore, even if there is an undulation at the boundary between the portion of the signal line 17 in the first groove 271 and the first planarization layer 270, the flatness of the region on which the anode 31 is located of the second planarization layer 280 may still be ensured, that is, the flatness of the anode 31 is ensured, thereby weakening the color breakup phenomenon of the light reflected by the anode 31.

It will be understood that, the vertical projection of the main body portion 311 on the substrate 100 being located within the vertical projection of the first groove 271 on the substrate 100 may be that, borders of the vertical projections of the two (the main body portion 311 and the first groove 271) on the substrate 100 coincide, alternatively, the border of the vertical projection of the main body portion 311 on the substrate 100 is located within the vertical projection of the first groove 271 on the substrate 100, and there is a gap between the borders of the vertical projections of the two on the substrate 100, alternatively, there is a certain gap between part of the border of the vertical projection of the main body portion 311 on the substrate 100 and the border of the vertical projection of the first groove 271 on the substrate 100, and the other part of the border of the vertical projection of the main body portion 311 on the substrate 100 coincides with the border of the vertical projection of the first groove 271 on the substrate 100.

For example, the border of the vertical projection of the main body portion 311 on the substrate 100 is located within the border of the vertical projection of the first groove 271 on the substrate 100, and there is a gap between the borders of the vertical projections of the two on the substrate 100. In this way, the requirement on the alignment accuracy between the first groove 271 and the anode 31 during the manufacturing process of the display panel 1100 may be reduced, and the manufacturing difficulty of the display panel 1100 may be reduced.

It will be understood that in some embodiments, in a case where there is no requirement for the lightness and thinness of the display substrate 100, it is possible to do not arrange the signal line 17 to be located in the first groove 271, and to arrange the vertical projection of the anode 31 on the substrate 100 to be located within the vertical projection of the signal line 17 on the substrate 100. In this way, the flatness of the anode 31 may also be increased.

Figure 10:
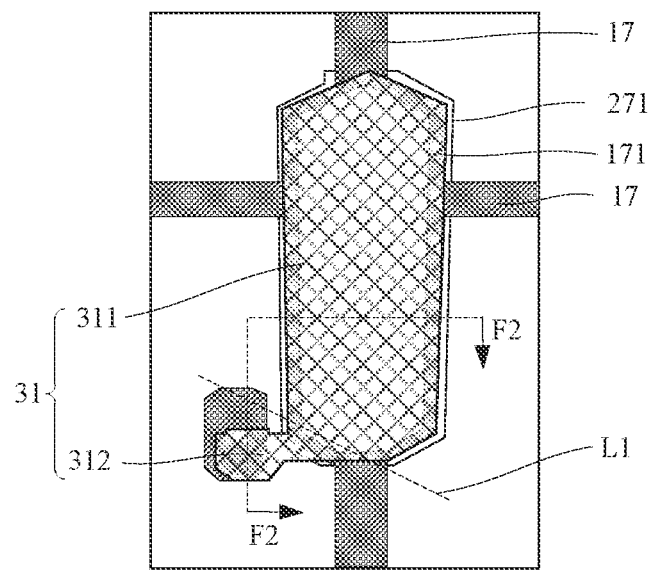
FIG. 10 is another partial enlarged view of the region C2 in FIG. 3.

In some embodiments, referring to FIG. 10, FIG. 10 is a partial enlarged view of the anode 31 in FIG. 3 (the anode 31 of the region C2 shown in FIG. 3). The first groove 271 is a frame-shaped groove connected end to end, and a line width of the portion of the signal line 17 located in the first groove 271 is less than that of a remaining portion of the signal line 17. That is, a width of the first groove 271 is less than that of the portion of the signal line 17 located outside the first groove 271. By reducing the line width of the portion of the signal line 17 located in the first groove 271, the impact of the signal line 17 on the flatness of the second planarization layer 280 may be reduced, so that the flatness of the second planarization layer 280 may be improved. The first groove 271 is a frame-shaped groove connected end to end, so that the portion of the signal line 17 located in the first groove 271 includes two sub-lines in parallel. As a result, a problem that the resistance of the signal line 17 is increased due to a reduction of the line width of the signal line 17 may be avoided.

It will be understood that, the first groove 271 may include a plurality of sub-grooves arranged side by side, so that the portion of the signal line 17 located in the first groove 271 includes a plurality of sub-lines arranged in parallel. As a result, the line width of a single sub-line is reduced. There may be gaps among the plurality of sub-lines, so as to reduce the impact of each sub-line on the flatness of the second planarization layer 280 and reduce the resistance of the signal line 17.

Figure 11:
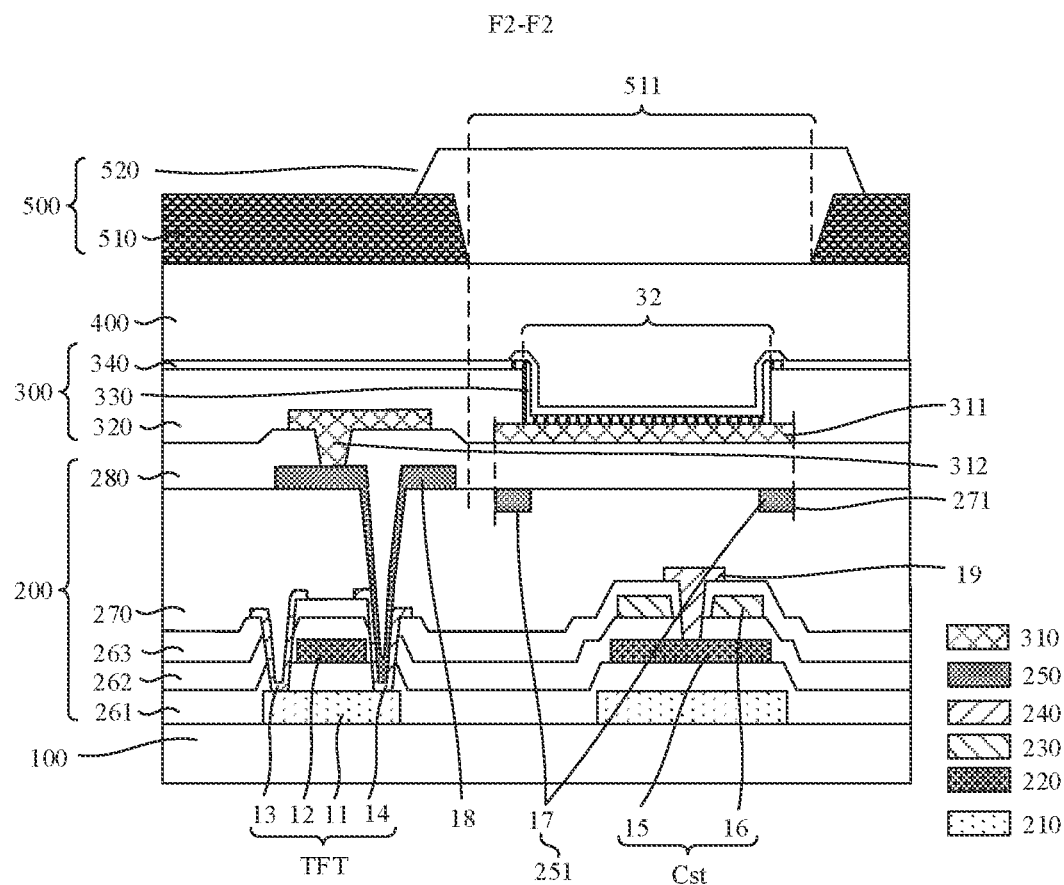
FIG. 11 is a sectional view taken along the section line F2-F2 in FIG. 10.

Referring to FIGS. 10 and 11, FIG. 11 is a sectional view taken along the section line F2-F2 in FIG. 10. In FIG. 11, other film layers of the display panel 1100 are provided on the basis of the film layers shown in FIG. 4. An outer border of the vertical projection of the first groove 271 on the substrate 100 substantially coincides with the border of the vertical projection of the main body portion 311 of the anode 31 on the substrate 100. That is, the vertical projection of the first groove 271 on the substrate 100 is located within the vertical projection of the main body portion 311 on the substrate 100, and is located at an edge region of the vertical projection of the main body portion 311 on the substrate 100. In this way, the flatness of a central region of the main body portion 311 may be improved, and a color breakup phenomenon of light reflected by the central region of the main body portion 311 may be weakened. Moreover, since part of ambient light reflected by an edge region of the main body portion 311 will enter a region where the black matrix 510 is located, the first groove 271 is arranged around the edge region of the main body portion 271 of the anode 31. In this way, even if there is an undulation on the edge region of the main body portion, it is possible to reduce light subjected to the color breakup and emitted from the filter portion 520, and to weaken the color halo formed on the light exit surface of the display panel 1100.

It will be understood that the first groove 271 is a frame-shaped groove. The vertical projection of the first groove 271 on the substrate 100 is in a shape of an annulus, and the annular projection encloses a closed region. The annular projection includes an inner border and an outer border. The inner border refers to a border of the closed region, and the outer border refers to a border away from the closed region.

Limited by a wiring space of the conductive pattern layer 250, the vertical projection of the signal line 17 on the substrate 100 generally overlaps with the vertical projection of the anode 31 on the substrate 100. That is, the vertical projection of the signal line 17 on the substrate 100 is less likely to be separated from the vertical projection of the anode 31 on the substrate 100. Therefore, in some embodiments, in a case where the wiring space of the conductive pattern layer 250 is limited, the outer border of the first groove 271 on the substrate 100 may be located within the projection of the anode 31 on the substrate 100.

Figure 12:
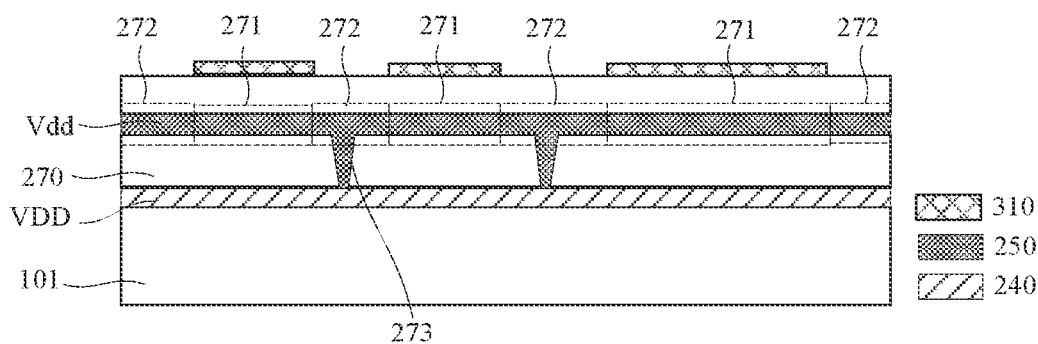
FIG. 12 is a sectional view taken along the section line D-D in FIG. 3.

In some embodiments, referring to FIG. 12, FIG. 12 is a sectional view taken along the section line D-D in FIG. 3. The number 101 shown in FIG. 12 refers to a base substrate 101, and the base substrate 101 is a structure including the substrate 100 and all film layers between the substrate 100 and the first planarization layer 270.

The surface of the first planarization layer 270 away from the substrate 100 further has a plurality of second grooves 272. A second groove 272 is located between two adjacent first grooves 271 and communicates the two adjacent first grooves 272. A portion of a same signal line 17, located between portions of the signal line located in the two adjacent first grooves 271, is located in the second groove 272. A surface, away from the substrate 100, of the portion of the signal line 17 located in the second groove 272 is substantially flush with a portion, except the plurality of first grooves 271 and the plurality of second groove 272, of the surface of the first planarization layer away from the substrate 100. In this way, the entire signal line 17 may be arranged in the grooves, and depths of the first groove 271 and the second groove 272 are substantially equal, so that the undulation of the signal line 17 in the thickness direction of the display panel 1100 is reduced, and the resistance at all positions of the signal line 17 is uniform. Furthermore, the flatness of a surface, away from the substrate 100, of a whole formed by the first planarization layer 270 and the conductive pattern layer 250 on a side may be further improved, the flatness of the second planarization layer 280 and the flatness of the anode layer 310 may be improved, and a risk of cracking caused by the undulation of the signal line 17 is reduced.

Figure 17:
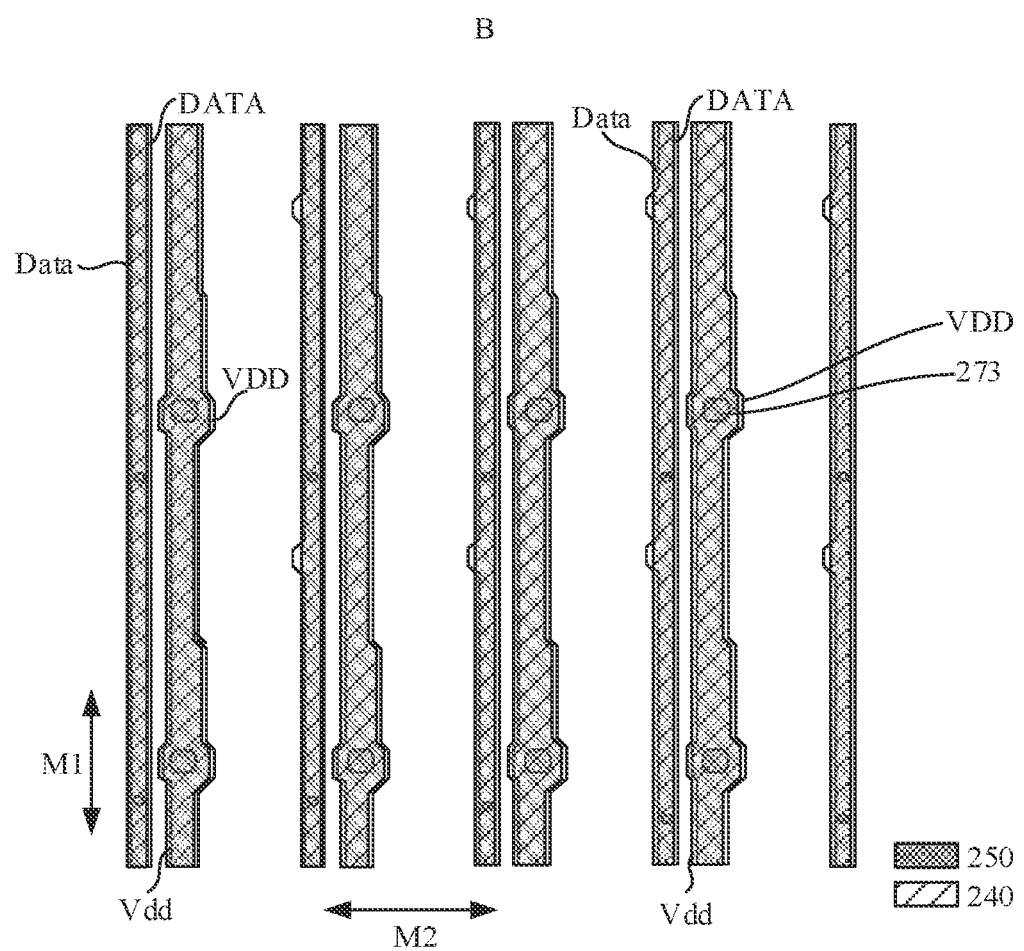
FIG. 17 is yet another structural diagram of the region B of the display panel in FIG. 1.

In some embodiments, as shown in FIG. 3, the plurality of voltage signal lines VDD included in the source-drain conductive layer 240 extend in a first direction M1, and the plurality of voltage signal lines VDD are arranged at intervals in a second direction M2. As shown in FIG. 17, the plurality of signal lines 17 may include at least one of a plurality of auxiliary data signal lines Data and a plurality of auxiliary voltage signal lines Vdd.

For example, the plurality of signal lines 17 may include a plurality of auxiliary data signal lines Data, the auxiliary data signal lines Data extend in the first direction M1, and the plurality of auxiliary data signal lines Data are arranged at intervals in the second direction M2, so that the plurality of auxiliary data signal lines Data are electrically insulated from each other. An auxiliary data signal line Data is opposite to a data signal line DATA in the source-drain conductive layer 240, and the auxiliary data signal line Data is electrically connected to the data signal line DATA opposite thereto through a connecting via hole provided in the first planarization layer 270, so that the auxiliary data signal line Data is connected in parallel to the data signal line DATA to reduce the resistance of the data signal line DATA.

For example, as shown in FIG. 17, the plurality of signal lines 17 may include a plurality of auxiliary data signal lines Data and a plurality of auxiliary voltage signal lines Vdd. The plurality of auxiliary data signal lines Data and the plurality of auxiliary voltage signal lines Vdd all extend in the first direction M1, and any two adjacent signal lines 17 are arranged at interval, so that the two adjacent signal lines 17 are electrically insulated from each other. An auxiliary data signal line Data is opposite to a data signal line DATA, and the auxiliary data signal line Data and the data signal line DATA opposite thereto are connected in parallel to reduce the resistance of the data signal line DATA. An auxiliary voltage signal line Vdd is opposite to a voltage signal line VDD, and the auxiliary voltage signal line Vdd is electrically connected to the voltage signal line VDD opposite thereto. That is, the auxiliary voltage signal line Vdd and the voltage signal line VDD opposite thereto are connected in parallel, so as to reduce the resistance of the voltage signal line VDD. For example, limited by the wiring space of the conductive pattern layer 250, in order to facilitate the arrangement of the plurality of signal lines 17, the line widths at all positions of the same signal line 17 are substantially equal.

For example, referring to FIG. 3, the plurality of signal lines 17 include a plurality of auxiliary voltage signal lines Vdd. An auxiliary voltage signal lines Vdd is electrically connected to a voltage signal lines VDD, so that the auxiliary voltage signal line Vdd is connected in parallel to the voltage signal line VDD to reduce the resistance of the voltage signal line VDD. The voltage signal line VDD of the source-drain electrode layer 240 is used to provide a common voltage signal for the pixel circuit. Since the common voltage signal provided for each pixel circuit may be the same, the plurality of auxiliary voltage signal lines Vdd may transmit signals with the same voltage. Therefore, the plurality of auxiliary voltage signal lines Vdd may be connected in parallel to further reduce the resistance of the auxiliary voltage signal lines Vdd.

In a case where the plurality of signal lines 17 include a plurality of auxiliary voltage signal lines Vdd, referring to FIG. 3, the plurality of auxiliary voltage signal lines Vdd may include a plurality of first auxiliary voltage signal lines Vdd1 and a plurality of second auxiliary voltage signal lines Vdd2. The plurality of first auxiliary voltage signal lines Vdd1 and the plurality of second auxiliary voltage signal lines Vdd2 intersect one another to form a mesh structure, so as to reduce the overall resistance of the plurality of auxiliary voltage signal lines Vdd.

The first auxiliary voltage signal lines Vdd1 extend in the first direction M1 and are arranged at intervals in the second direction M2. An auxiliary voltage signal line Vdd is opposite to a voltage signal line VDD. Referring to FIG. 3, the first planarization layer 270 further includes a plurality of first via holes 273, and a first auxiliary voltage signal line Vdd1 is electrically connected to a voltage signal line VDD opposite thereto through at least one first via hole 273. The second auxiliary voltage signal lines Vdd2 extend in the second direction M2 and are arranged at intervals in the first direction M1. The plurality of second auxiliary voltage signal lines Vdd2 are configured to electrically connect the plurality of first auxiliary voltage signal lines Vdd1.

In some embodiments, referring to FIG. 2A, the plurality of conductive patterns 251 of the conductive pattern layer 250 further include a plurality of transition blocks 18. A transition block 18 is configured to electrically connect an anode 31 to a source-drain electrode pattern 19 (a drain 14) of a thin film transistor. The first planarization layer 270 further has a plurality of second via holes 274, and the transition block 18 is electrically connected to the source-drain electrode pattern 19 through at least one second via hole 274. The second planarization layer 280 has a plurality of third via holes 281, and the connection portion 312 of the anode 31 is electrically connected to the transition block 18 through at least one third via hole 281. A vertical projection of the second via hole 274 on the substrate 100 and a vertical projection of the third via hole 281 on the substrate 100 are separated from each other, which is beneficial to improve the stability of the connection between the anode 31 and the transition block 18.

For example, referring to FIG. 2A, each transition block 18 is electrically connected to a source-drain electrode pattern 19 through a second via hole 274. A connection portion 312 of each anode 31 is electrically connected to an transition block 18 through a third via hole 281. The source-drain electrode pattern 19 includes the drain electrode 14 of the thin film transistor. As shown in FIG. 2A, the transition block 18 is electrically connected to a source-drain electrode pattern 19 through a second via hole 274, that is, the transition block 18 is electrically connected to the drain electrode 14 of the thin film transistor through the second via hole 274.

There is a need to electrically connect the anode 31 to a source-drain electrode pattern 19, at least the first planarization layer 270 and the second planarization layer 280 are disposed between the anode layer 310 and the source-drain electrode pattern 19, and a gap between the anode layer 310 and the source-drain electrode pattern 19 is large. By providing the transition block 18, it is possible to prevent the connection via hole between the connection portion 312 of the anode 31 and the source-drain electrode pattern 19 from being too deep, thereby improving the reliability of the connection between the anode 31 and the source-drain electrode pattern 19.

Referring to FIGS. 4 and 5, the vertical projection of the connection portion 312 on the substrate 100 overlaps with the vertical projection of the transition block 18 on the substrate 100, so that the connection portion 312 may be electrically connected to the transition block 18 through at least one third via hole.

In some embodiments, referring to FIG. 5, the vertical projection of the transition block 18 on the substrate 100 overlaps with a vertical projection of a filter portion 520 on the substrate 100. The transition block 18 includes a first portion 181. A vertical projection of the first portion 181 on the substrate 100 is located within the vertical projection of the filter portion 520 on the substrate 100, and a vertical projection of a portion, whose vertical projection on the substrate 100 coinciding with the vertical projection of the first portion 181 on the substrate 100, of the filter portion 520 on the substrate 100 is located within the vertical projection of the anode 31 on the substrate 100, so that the vertical projection of the first portion 181 of the transition block 18 on the substrate 100 is located within the vertical projection of the anode 31 on the substrate 100.

In this way, the flatness of a surface of a whole formed by the first portion 181 and the first planarization layer 270 may affect the flatness of the anode 31. Ambient light reflected by a portion of the anode 31 opposite to the first portion 181 may exit from the filter portion 520, and thus the higher the flatness of the surface of the whole formed by the first portion 181 and the first planarization layer 270 is, the smaller the degree of the color breakup of the ambient light reflected by the portion of the anode 31 opposite to the first portion 181 is.

Based on this, in order to improve the flatness of the portion of the anode 31 opposite to the first portion 181, referring to FIGS. 4 and 5, the surface of the first planarization layer 270 away from the substrate 100 further has a plurality of third grooves 275. Only a single third groove 275 is exemplarily shown in FIGS. 4 and 5. At least a portion of the transition block 18 is located in a third groove 275, and a vertical projection of the at least a portion of the transition block located in the third groove 275 on the substrate 100 overlaps with the vertical projection of the filter portion 520 on the substrate 100. That is, a vertical projection of the portion of the transition block 18 located in the third groove 275 on the substrate 100 overlaps with the vertical projection of the filter portion 520 on the substrate 100. Based on this, at least a portion of the first portion 181 of the transition block 18 is located in a third groove 275.

At least a portion of the first portion 181 is located in the third groove 275, and a surface, away from the substrate 100, of the at least a portion of the transition block 18 located in the third groove 275 is substantially flush with a portion, except the plurality of first grooves 271 and the plurality of third grooves 275, of the surface of the planarization layer 270 away from the substrate 100. In this way, the flatness of the portion of the anode 31 opposite to the first portion 181 may be improved, and the degree of color breakup of the ambient light reflected by the portion of the anode 31 opposite to the first portion 181 may be reduced. As a result, the possibility of color halo formed on the light exit surface of the display panel 1100 may be reduced, the risk of dazzling the human eyes may be reduced, and the user experience may be improved.

For example, referring to FIGS. 4 and 5, the entire first portion 181 of each transition block 18 is located in a third groove 275, so that the degree of color breakup of the ambient light reflected by the portion of the anode 31 opposite to the first portion 181 may be reduced to a greater extent, and the possibility of the color halo formed on the light exit surface of the display panel 1100 may be reduced.

It will be understood that, among the plurality of transition blocks 18 included in the conductive pattern layer 250, vertical projections of some transition blocks 18 on the substrate 100 may each overlap with the vertical projection of the filter portion 520 on the substrate 100, that is, the some transition blocks 18 each have the first portion 181; alternatively, vertical projections of all the transition blocks 18 on the substrate 100 each overlap with the vertical projection of the filter portion 520 on the substrate 100, that is, all of the transition blocks 18 each have the first portion 181.

For example, referring to FIGS. 3 to 5, and 8 to 9, among the plurality of transition blocks 18, the vertical projections of some of the transition blocks 18 on the substrate 100 overlap with the vertical projection of the filter portion 520 on the substrate 100. That is, only some transition blocks 18 each have the first portion 181. The vertical projection of the transition block 18 shown in FIG. 4 on the substrate 100 overlaps with the vertical projection of the filter portion 520 on the substrate 100, in this case, the transition block 18 includes the first portion 181. The vertical projection of the transition block 18 shown in FIG. 8 on the substrate 100 and the vertical projection of the main body portion 311 of the anode 31 on the substrate 100 are separated from each other, that is, the vertical projection of the transition block 18 on the substrate 100 and the vertical projection of the filter portion 520 on the substrate 100 are separated from each other, and in this case, the transition block 18 does not have the first portion 181.

Figure 6:
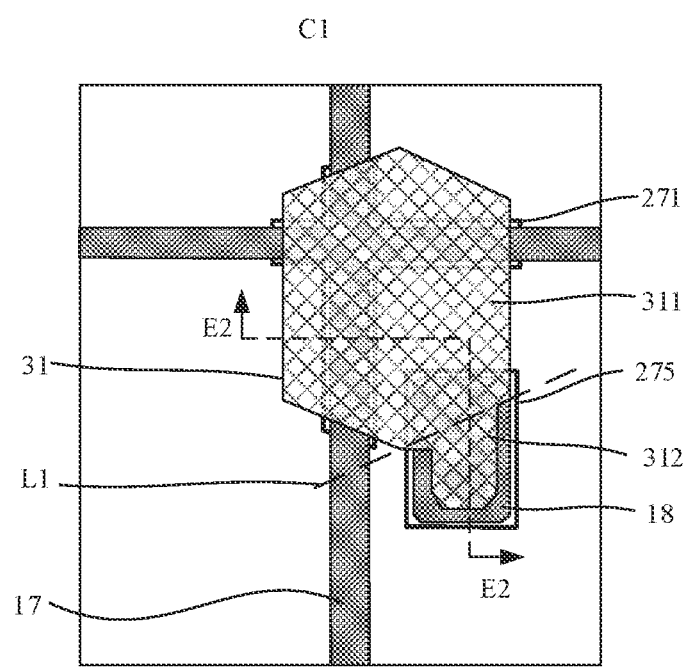
FIG. 6 is another partial enlarged view of the region C1 in FIG. 3.
Figure 7:
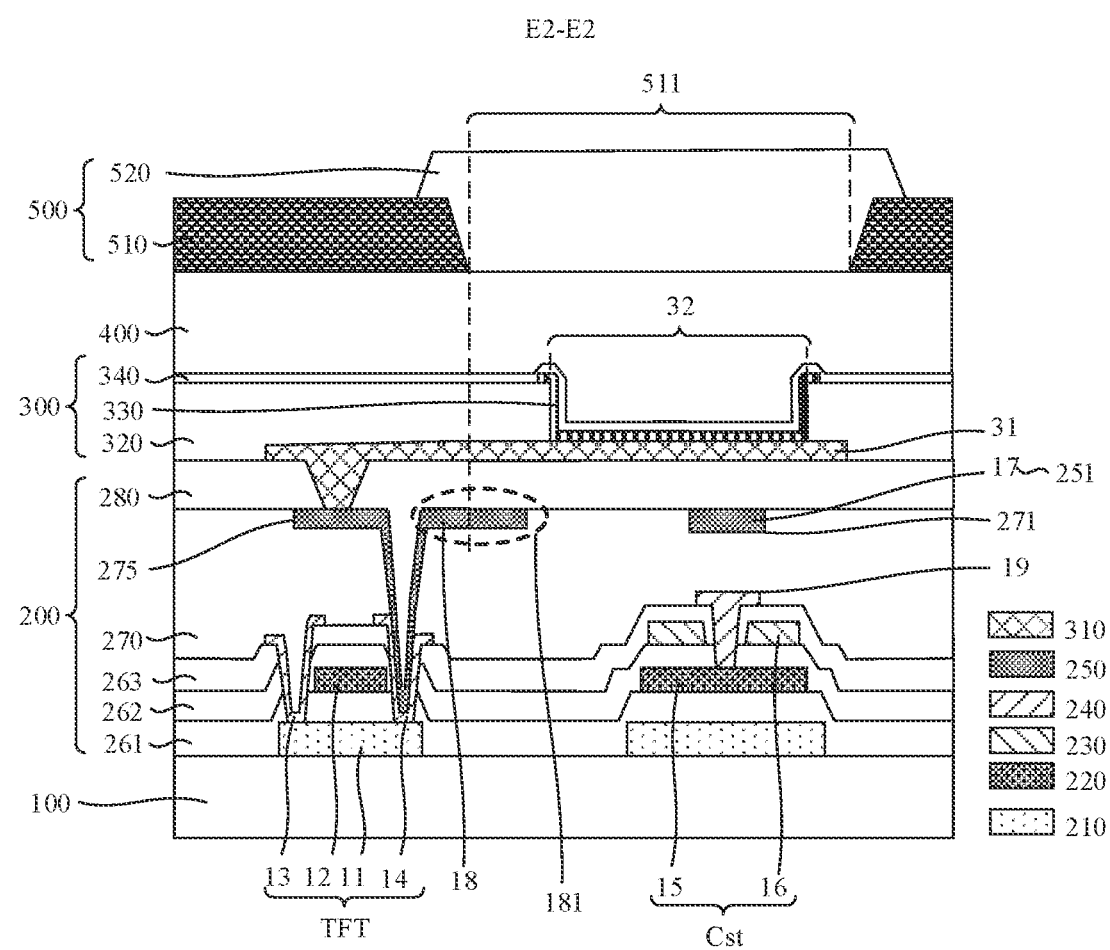
FIG. 7 is a sectional view taken along the section line E2-E2 in FIG. 6.

In some embodiments, referring to FIGS. 6 and 7, each transition block 18 may be disposed in a third groove 275. In this way, the undulation of the transition block 18 in the thickness direction of the display panel 1100 may be reduced, which avoids a problem of uneven resistance of the transition block 18 (e.g., occurring at the boundary of the first portion 181 and a remaining portion), and avoids the risk of cracking of the transition block 18 at the boundary of the first portion 181 and the remaining portion. Moreover, the alignment accuracy between the first portion 181 and the filter portion 520 may be reduced during the manufacturing process of the display panel 1100, that is, the accuracy of a position where the third groove 275 is arranged is reduced; and the alignment accuracy between the conductive pattern layer 250, the anode layer 310 and the color filter layer 500 is reduced. As a result, the manufacturing difficulty of the display panel 1100 is reduced.

In some embodiments, as shown in FIGS. 8 and 9, in the case where the vertical projection of the transition block 18 on the substrate 100 and the vertical projection of the main body portion 311 on the substrate 100 are separated from each other, the third groove 275 may not be provided in the first planarization layer 170. That is, the transition block 18 is directly disposed on the surface of the first planarization layer 170 away from the substrate 100.

In some embodiments, the conductive pattern layer 250 is generally formed through a sputtering process, and a thickness of the conductive pattern 251 formed in the conductive pattern layer 250 is generally in a range of 0.6 μm to 0.7 μm. For example, the thickness of the conductive pattern 251 may be 0.6 μm, 0.65 μm, or 0.7 μm, which will not be listed here.

Adapted to the thickness of the conductive pattern 251, the depths of the first groove 271, the second groove 272 and the third groove 275 may all be in a range of 0.6 μm to 0.7 μm. For example, the depths of the first groove 271, the second groove 272 and the third groove 275 may each be 0.6 μm, 0.65 μm, or 0.7 μm, which will not be listed here.

The thickness of the conductive pattern 251, the depth of the first groove 271, the depth of the second groove 272 and the depth of the third groove 275 are substantially equal, so that a surface away from the substrate 100 of a portion of the conductive pattern 251 located in the first groove 271, a surface away from the substrate 100 of a portion of the conductive pattern 251 located in the second groove 272, and a surface away from the substrate 100 of a portion of the conductive pattern 251 located in the third groove 275 are substantially flush with a portion, except the plurality of first grooves 271, the plurality of second grooves 272 and the plurality of third grooves 275, of the surface of the first planarization layer 270 away from the substrate 100. In this way, the surface, away from the substrate 100, of a whole formed by the first planarization layer 270 and the conductive pattern layer 250 is substantially flat, which improves the flatness of the entire second planarization layer 280, and improves the flatness of the anode layer 310.

In some embodiments, the thickness of the first planarization layer 270 is in a range of 1.5 μm to 3.0 μm. The thickness of the first planarization layer 270 is so thin that it is not beneficial for the first planarization layer 270 to form a substantially flat surface. Therefore, the thickness of the first planarization layer 270 is greater than or equal to 1.5 μm.

In some embodiments, the larger the thickness of the first planarization layer 270 is, the flatter the surface of the first planarization layer 270 away from the substrate 100 is. However, it is not beneficial for the lightness and thinness of the display panel 1100. Therefore, the thickness of the first planarization layer 270 is generally less than or equal to 3.0 μm.

In this way, the thickness of the first planarization layer is in a range of 1.5 μm to 3.0 μm. For example, the thickness of the first planarization layer 270 may be 1.5 μm, 2.0 μm, 2.4 μm or 3.0 μm, which will not be listed here.

In some embodiments, the thickness of the second planarization layer 280 is in a range of 1.0 μm to 2.0 μm. For example, the thickness of the second planarization layer 280 may be 1.5 μm, 2.0 μm, 2.4 μm or 3.0 μm, which will not be listed here.

In some embodiments, referring to FIG. 2B, in the case where the patterned conductive layers of the pixel circuit layer 200 include the active layer 210, the first gate conductive layer 220, the second gate conductive layer 230 and the conductive pattern layer 250 that are stacked, the first planarization layer 270 is located between the second gate conductive layer 230 and the conductive pattern layer 250, and a surface of the first planarization layer 270 proximate to the substrate 100 is in direct contact with the second gate conductive layer 230. In this way, the first planarization layer 270 is further configured to separate the second gate conductive layer 230 from a region, does not need to be connected to the second gate conductive layer 230, of the conductive pattern layer 250.

Figure 13:
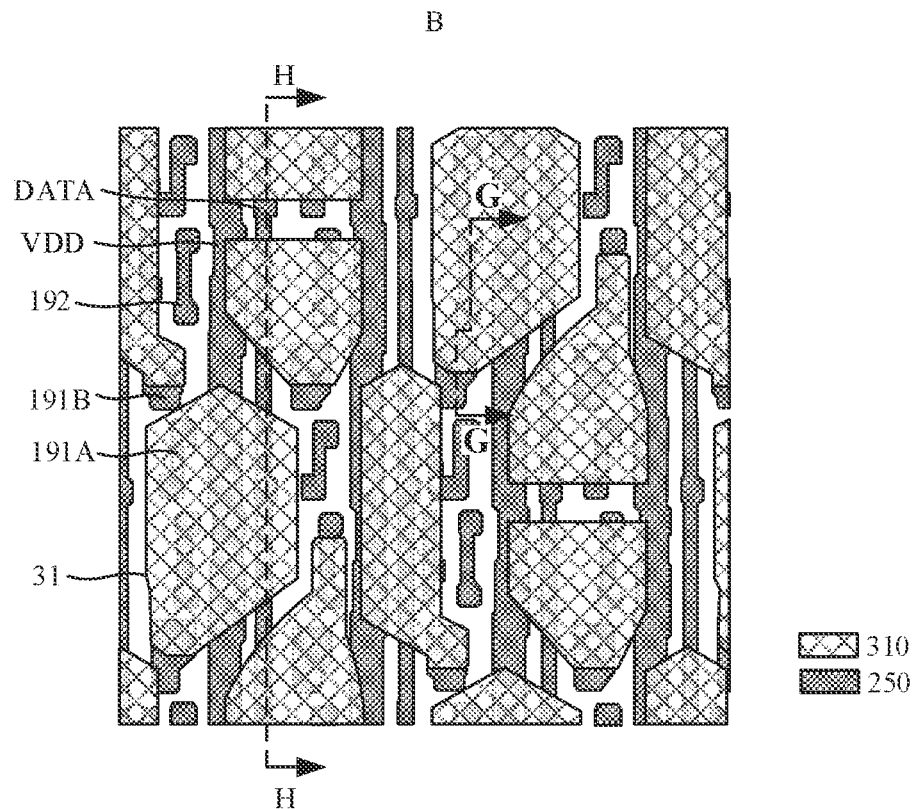
FIG. 13 is another structural diagram of the region B of the display panel in FIG. 1.

Referring to FIG. 13, FIG. 13 is another structural diagram of the region B of the display panel in FIG. 1 in the case where the patterned conductive layers include the active layer 210, the first gate conductive layer 220, the second gate conductive layer 230 and the conductive pattern layer 250 that are stacked. FIG. 13 only exemplarily shows the conductive pattern layer 250 and the anode layer 310. The conductive pattern layers 250 include at least one of a plurality of voltage signal lines VDD, a plurality of data signal lines DATA, and source-drain electrode patterns 19 of the thin film transistors. A plurality of source-drain electrode patterns 19 of the plurality of thin film transistors include first source-drain electrode patterns 191 and second source-drain electrode patterns 192.

Referring to FIG. 13, a vertical projection of the first source-drain electrode pattern 191 on the substrate 100 overlaps with the vertical projection of the anode 31 on the substrate 100. A vertical projection of each (the first source-drain electrode pattern 191A in FIG. 13) of some first source-drain electrode patterns 191 on the substrate 100 is located within the vertical projection of the anode 31 on the substrate 100, and a vertical projection of each (the first source-drain electrode pattern 191B in FIG. 13) of some first source-drain electrode patterns 191 on the substrate 100 and the vertical projection of the anode 31 on the substrate 100 are partially coincident with each other, and partially separated from each other.

Figure 14A:
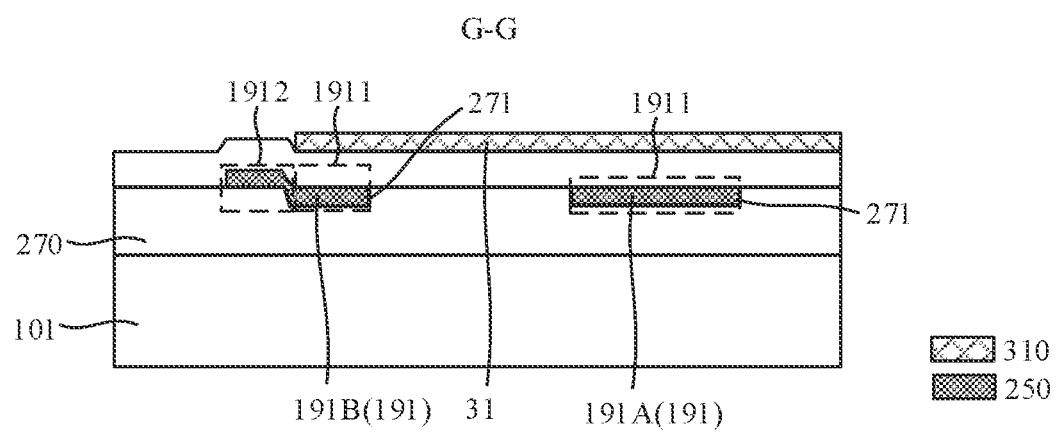
FIG. 14A is a sectional view taken along the section line G-G in FIG. 13.

Referring to FIG. 14A, the first source-drain electrode pattern 191B includes a second portion 1911. A vertical projection of the second portion 1911 on the substrate 100 is located within the vertical projection of the anode 31 on the substrate 100, and the second portion 1911 is located in the first groove 271.

In a case where the vertical projection of the first source-drain electrode pattern 191 (the first source-drain electrode pattern 191A in FIGS. 13, 14A and 14B) on the substrate 100 is located within the vertical projection of the anode 31 on the substrate 100, the second portion 1911 of the first source-drain electrode pattern 191 includes the entire first source-drain electrode pattern 191. In this way, the first source-drain electrode pattern 191 is located in the first groove 271.

In a case where the vertical projection of the first source-drain electrode pattern 191 (the first source-drain electrode pattern 191B in FIGS. 13, 14A and 14B) on the substrate 100 and that of the anode 31 on the substrate 100 are partially coincident with each other and partially separated from each other, the first source-drain electrode pattern 191 further includes a third portion 1912, and a vertical projection of the third portion 1912 on the substrate 100 is located outside the vertical projection of the anode 31 on the substrate 100. For example, referring to FIG. 14A, the second portion 1911 is located in the first groove 271, and the third portion 1912 may be located on the surface of the first planarization layer 270 away from the substrate 100.

Referring to FIG. 13, a vertical projection of the second source-drain electrode pattern 192 on the substrate 100 and the vertical projection of the anode 31 on the substrate 100 are separated from each other. The second source-drain electrode pattern 192 may be disposed in a groove, or directly disposed on the surface of the first planarization layer 270 away from the substrate 100, or partially disposed in the groove, and partially disposed on the surface of the first planarization layer 270 away from the substrate 100, which will not be limited in the embodiments of the present disclosure.

In the display panel 1100 provided by the embodiments of the present disclosure, the second portion 1911 of the source-drain electrode pattern 19 is disposed in the first groove 271, and a surface of the second portion 1911 away from the substrate 100 is substantially flush with the portion, except the plurality of first grooves 271, of the surface of the first planarization layer 270 away from the substrate 100, so that a surface, away from the substrate 100, of a whole formed by the first planarization layer 270 and the second portion 1911 is approximately flat. As a result, the flatness of a region of the second planarization layer 280 that is in contact with the second portion 1911 may be improved, and the flatness of a portion of anode 31 opposite to the second portion 1911 may be improved, and in turn, the degree of color breakup of the ambient light reflected by the anode 31 is reduced, the possibility of the color halo formed on the light-emitting surface of the display panel 1100 is reduced, the risk of dazzling the human eyes is reduced, and the user experience is enhanced.

Figure 14B:
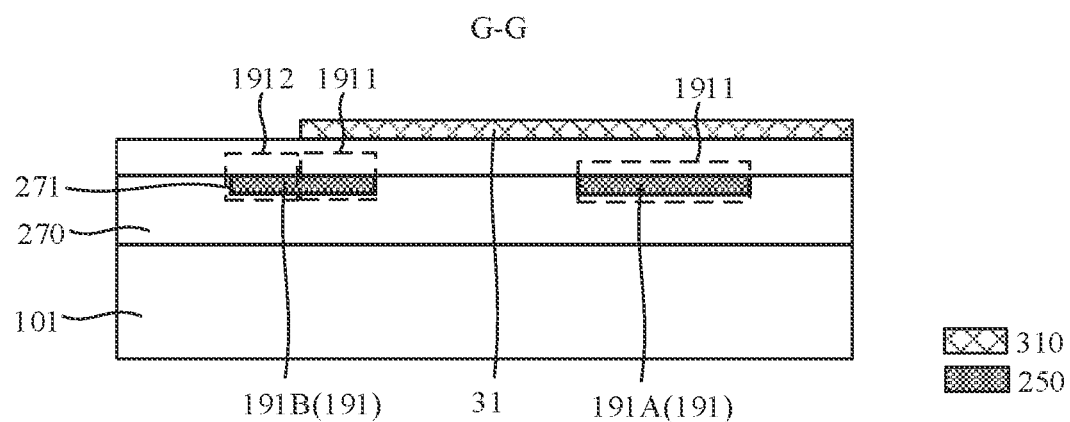
FIG. 14B is another sectional view taken along the section line G-G in FIG. 13.

In some embodiments, referring to FIG. 14B, the second portion 1911 and the third portion 1912 of the same first source-drain electrode pattern 191 are all located in the first groove 271, so that the undulation of the first source-drain electrode pattern 191 in the thickness direction of the display panel 1100 may be reduced. As a result, a problem of sudden change in resistance (occurring at the boundary of the second portion 1911 and the remaining portion) of the first source-drain electrode pattern 191 may be avoided, and the risk of cracking of the first source-drain electrode pattern 191B at the boundary of the second portion 1911 and the remaining portion is reduced. Furthermore, the requirement on the alignment accuracy between the first groove 271 and the anode 30 may be reduced during the manufacturing process of the display panel 1100, and the manufacturing difficulty of the display panel 1100 may be reduced.

Figure 15A:
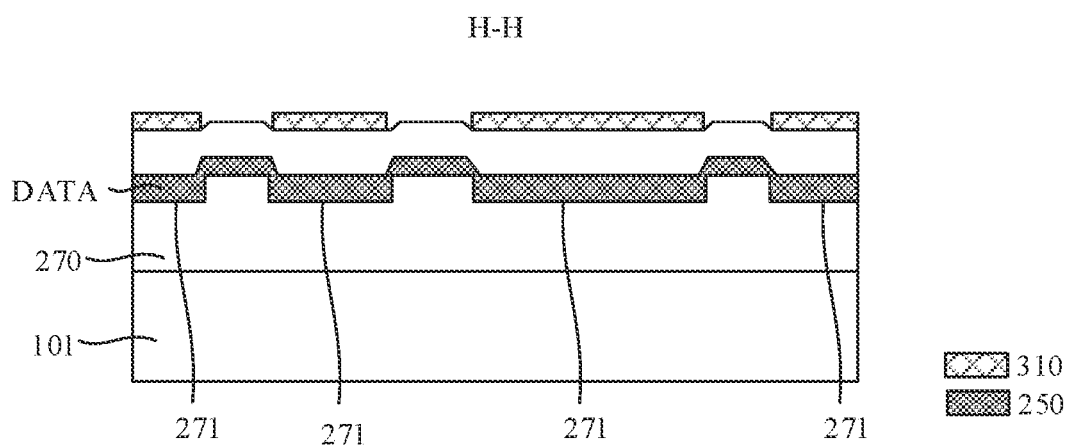
FIG. 15A is a sectional view taken along the section line H-H in FIG. 13.

In some embodiments, referring to FIG. 15A, the data signal line DATA is shown as an example in FIG. 15A, which may also be a voltage signal line VDD. A portion, whose vertical projection on the substrate 100 overlapping with a vertical projection of an anode 31 on the substrate 100, of each of at least one of the plurality of voltage signal lines VDD and the plurality of data signal lines DATA included in the conductive pattern layer 250 is located in a first groove 271.

For example, each voltage signal line VDD includes at least one first sub-segment, a vertical projection of each first sub-segment on the substrate 100 is located within a vertical projection of an anode 31 on the substrate 100, and the first sub-segment is located in a first groove 271. Each data signal line DATA includes at least one second sub-segment, a vertical projection of a second sub-segment on the substrate 100 is located within a vertical projection of an anode 31 on the substrate 100, and the second sub-segment is located in a first groove 271.

In this way, the flatness of a region, in contact with the voltage signal line VDD and the data signal line DATA and configured to arrange the anode 31, of the second planarization layer 280 may be improved, and in turn, the flatness of a portion of the anode 31 is improved, and the degree of the color separation of the ambient light reflected by the anode 31 is reduced.

Figure 15B:
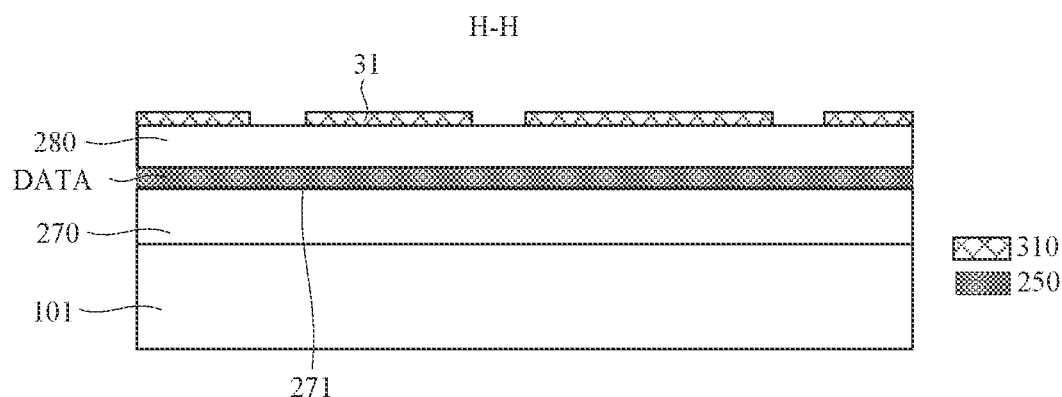
FIG. 15B is another sectional view taken along the section line H-H in FIG. 13.

In some embodiments, referring to FIG. 15B, each of at least one of the plurality of voltage signal lines VDD and the plurality of data signal lines DATA may be disposed in a first groove 271. That is, each of at least one of the entire voltage signal line VDD and the entire data signal line DATA is disposed in a first groove 271. FIG. 15B is illustrated by taking an example in which the entire data signal line DATA is located in a first groove 271.

For example, each voltage signal line VDD is located in a first groove 271, and each data signal line DATA is located in a first groove 271. In this way, the undulation of the voltage signal line VDD and the data signal line DATA in the thickness direction of the display panel 1100 may be reduced, the resistance of positions of the voltage signal line VDD and the data signal line DATA extending in a length direction may be more uniform, and the risk of cracking of the voltage signal line VDD and the data signal line DATA can be reduced, and further, the requirement on the alignment accuracy between the first groove 271 and the anode 31 may also be reduced.

In some embodiments, a material of the first planarization layer 270 includes an organic material, so that the first planarization layer 270 with a substantially flat surface may be formed through a coating process. A material of the second planarization layer 280 may include an organic material, so that the second planarization layer 280 with a substantially flat surface may be formed through a coating process. For example, the material of the first planarization layer 270 and the material of the second planarization layer 280 may be the same.

Figure 16:
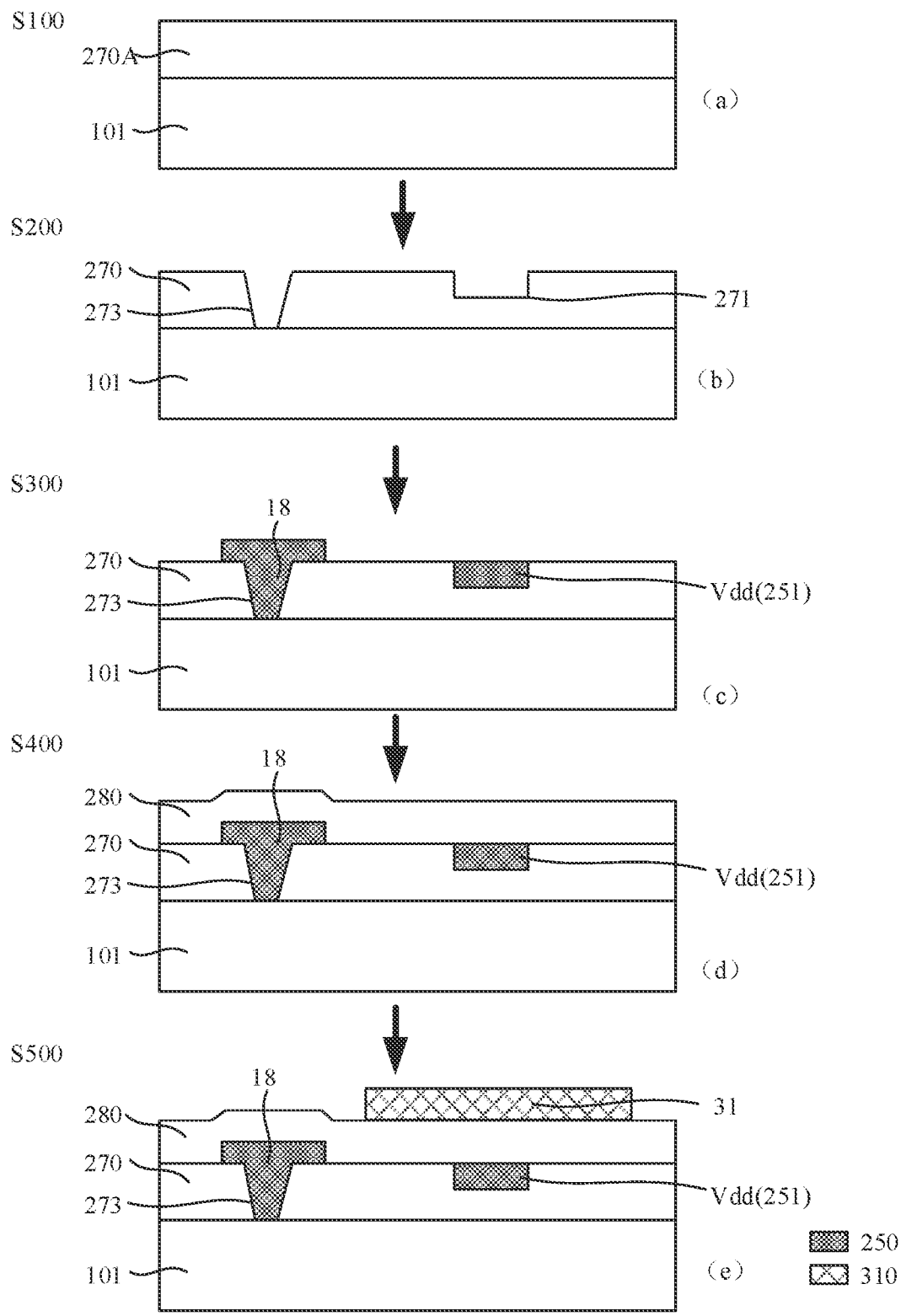
FIG. 16 is a schematic diagram showing manufacturing steps of a display panel, in accordance with some embodiments.

Some embodiments of the present disclosure provide a method for manufacturing a display panel. Referring to FIG. 16, the manufacturing method includes following steps.

In S100, as shown in part (a) in FIG. 16, an insulating material film 270A is formed on a side of a base substrate 101.

The base substrate 101 is a structure including a substrate 100 and all film layers between the substrate 100 and the insulating material film 270A in the display panel 1100.

Considering an example in which patterned conductive layers include an active layer 210, a first gate conductive layer 220, a second gate conductive layer 230, a source-drain conductive layer 240 and a conductive pattern layer 250 that are stacked, the base substrate 101 further includes a first gate insulating layer 261 located between the active layer 210 and the first gate conductive layer 220, a second gate insulating layer 262 located between the first gate conductive layer 220 and the second gate conductive layer 230, an interlayer dielectric layer 263 located between the second gate conductive layer 230 and the source-drain conductive layer 240.

For example, an insulating material used for the insulating material film 270A includes an organic material. In this way, the insulating material film 270A may be formed by the insulating material through a coating process, and a surface of the insulating material film 270A away from the base substrate 101 is substantially flat. A thickness of the insulating material film 270A may be in a range of 1.5 μm to 3 μm.

In S200, as shown in part (b) in FIG. 16, a plurality of first grooves 271 are formed in the insulating material film 270A to form a first planarization layer 270.

For example, the plurality of first grooves 271 may be formed through a photolithography process (including exposure, etching, development, etc.). The depth of the first groove 271 may be in a range of 0.6 μm to 0.7 μm.

In S300, as shown in part (c) in FIG. 16, the conductive pattern layer 250 is formed on a surface of the first planarization layer 270 away from the substrate 100.

The conductive pattern layer 250 includes a plurality of conductive patterns 251. At least a portion of the plurality of conductive pattern 251 is located in a first groove, and the thickness of the at least a portion of the conductive pattern 251 located in the first groove 271 is substantially equal to the depth of the first groove 271, so that the surface of the portion of the conductive pattern 251 located in the first groove 271 and away from the substrate 100 is substantially flush with a portion, except the plurality of first grooves 271, of the surface of the first planarization layer 270 away from the substrate 100. Adapted to the depth of the first groove 271, the thickness of the conductive pattern 251 located in the first groove 271 may be in a range of 0.6 μm to 0.7 μm.

In S400, as shown in part (d) in FIG. 16, a second planarization layer 280 is formed on a surface of the conductive pattern layer 250 away from the substrate 100.

For example, an insulating material used for the second planarization layer 280 includes an organic material. In this way, the second planarization layer 280 may be formed by the insulating material through a coating process, and a surface of the second planarization layer 280 away from the base substrate 101 is substantially flat. The thickness of the second planarization layer 280 may be in a range of 1.0 μm to 2.0 μm.

In S500, as shown in part (e) in FIG. 16, an anode layer 310 is formed on a surface of the second planarization layer 280 away from the substrate 100.

The anode layer 310 includes a plurality of anodes 31 separated from each other. A vertical projection of an anode 31 on the substrate 100 overlaps with a vertical projection of at least one first groove 271 on the substrate 100.

The display panel 1100 obtained through the manufacturing method provided by the embodiments of the present disclosure has the same beneficial effects as the display panel 1100 provided by any of the above embodiments, which will not be repeated herein.

In some embodiments, the plurality of conductive patterns 251 include a plurality of auxiliary voltage signal lines Vdd and a plurality of transition blocks 18.

Before forming the insulating material film 270A on a side of the base substrate 101 in S100, the method further includes S001.

In S001, a source-drain conductive layer is formed on the substrate to form the base substrate 101.

The conductive pattern layer 240 includes at least a plurality of voltage signal lines VDD, a plurality of data signal lines DATA, and source-drain electrode patterns of thin film transistors.

Referring to FIG. 16, in S200, while the plurality of first grooves 271 are formed in the insulating material film 270A, the manufacturing method further includes:

forming a plurality of first via holes 273 and a plurality of second via holes 274 (not shown in FIG. 16) in the insulating material film 270A. That is, in S200, the plurality of first grooves 271, the plurality of first via holes 273 and the plurality of second via holes 274 are formed in the insulating material film 270A.

For example, the plurality of first grooves 271, the plurality of first via holes 273 and the plurality of second via holes 274 may be obtained by simultaneously etching the insulating material film 270A through a photolithography process using a halftone mask.

An end of a first via hole 273 proximate to the base substrate 101 exposes a portion of a voltage signal line VDD (not shown in the figure), and a portion of an auxiliary voltage signal line Vdd is located in at least one first via hole 273, and is electrically connected to the voltage signal line VDD.

An end of a second via hole 274 proximate to the substrate 100 exposes a portion of a source-drain electrode pattern (not shown in the figure), and a portion of an transition block 18 is located in at least one second via hole 274, and is electrically connected to a source-drain electrode pattern of a thin film transistor.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
    a substrate;
    a first planarization layer disposed on a side of the substrate, a surface of the first planarization layer away from the substrate having a plurality of first grooves;
    a conductive pattern layer disposed on the surface of the first planarization layer away from the substrate and including a plurality of conductive patterns, wherein at least a portion of a conductive pattern is located in a first groove, and a surface, away from the substrate, of the at least the portion of the conductive pattern located in the first groove is substantially flush with a portion, except the plurality of first grooves, of the surface of the first planarization layer away from the substrate;
    a second planarization layer disposed on a surface of the conductive pattern layer away from the substrate;
    an anode layer disposed on a surface of the second planarization layer away from the substrate and including a plurality of anodes, wherein a vertical projection of the at least the portion of the conductive pattern located in the first groove on the substrate overlaps with a vertical projection of an anode on the substrate; and
    a source-drain conductive layer disposed between the substrate and the first planarization layer and including at least one of a plurality of voltage signal lines, a plurality of data signal lines, and source-drain electrode patterns of thin film transistors; wherein
    the plurality of conductive patterns include a plurality of signal lines, at least a portion of a signal line is located in the first groove;
    wherein the plurality of signal lines include at least one of a plurality of auxiliary data signal lines and a plurality of auxiliary voltage signal lines;
    wherein the source-drain conductive layer includes at least the voltage signal lines;
    the voltage signal lines extend in a first direction, and are arranged at intervals in a second direction;
    the plurality of signal lines include the plurality of auxiliary voltage signal lines, an auxiliary voltage signal line is electrically connected to a voltage signal line;
    the plurality of auxiliary voltage signal lines include:
    a plurality of first auxiliary voltage signal lines, the first auxiliary voltage signal lines extending in the first direction and being arranged at intervals in the second direction, and a first auxiliary voltage signal line being opposite to a voltage signal line; and
    a plurality of second auxiliary voltage signal lines, the second auxiliary voltage signal lines extending in the second direction and being arranged at intervals in the first direction, and the plurality of second auxiliary voltage signal lines being configured to electrically connect the plurality of first auxiliary voltage signal lines; wherein
    the first planarization layer further has a plurality of first via holes, the first auxiliary voltage signal line is electrically connected to the voltage signal line opposite thereto through at least one first via hole.

2. The display panel according to claim 1, wherein line widths at all positions of the signal line are substantially equal, and a vertical projection of the first groove on the substrate passes a vertical projection of the anode on the substrate in an extending direction of the signal line.

3. The display panel according to claim 1, further comprising a pixel definition layer disposed on a side of the anode layer away from the substrate, the pixel definition layer having a plurality of first openings, wherein
    the anode includes a main body portion, a vertical projection of a first opening on the substrate is located within a vertical projection of the main body portion on the substrate; and
    the vertical projection of the main body portion of the anode on the substrate is located within a vertical projection of the first groove on the substrate.

4. The display panel according to claim 1, wherein
    the first groove is a frame-shaped groove connected end to end, a line width of the at least the portion of the signal line located in the first groove is less than a line width of a remaining portion of the signal line.

5. The display panel according to claim 4, further comprising a pixel definition layer disposed on a side of the anode layer away from the substrate, the pixel definition layer having a plurality of first openings, wherein
    an anode includes a main body portion, a vertical projection of a first opening on the substrate is located within a vertical projection of the main body portion on the substrate; and
    an outer border of a vertical projection of the first groove on the substrate substantially coincides with a border of the vertical projection of the main body portion on the substrate.

6. The display panel according to claim 1, wherein
the surface of the first planarization layer away from the substrate further has a plurality of second grooves, a second groove is located between two adjacent first grooves and communicates with the two adjacent first grooves; a portion, located between portions of the signal line located in the two adjacent first grooves, of the signal line is located in the second groove, and a surface, away from the substrate, of a portion of the signal line located in the second groove is substantially flush with a portion, except the plurality of first grooves and the plurality of second grooves, of the surface of the first planarization layer away from the substrate.

7. The display panel according to claim 1, further comprising a color filter layer, the color filter layer being disposed on a side of the anode layer away from the substrate, and including a plurality of filter portions arranged at intervals; wherein
the surface of the first planarization layer away from the substrate further has a plurality of third grooves;
the source-drain conductive layer includes at least the source-drain electrode patterns of the thin film transistors; and
the conductive pattern layer further includes a plurality of transition blocks, a transition block is configured to electrically connect an anode to a source-drain electrode pattern of a thin film transistor; at least a portion of the transition block is located in a third groove, a vertical projection of the at least a portion of the transition block located in the third groove on the substrate overlaps with a vertical projection of a filter portion on the substrate; and a surface, away from the substrate, of the portion of the transition block located in the third groove is substantially flush with a portion, except the plurality of the first grooves and the third grooves, of the surface of the planarization layer away from the substrate.

8. The display panel according to claim 7, wherein
the transition block includes a first portion, a vertical projection of the first portion of the transition block on the substrate is located within the vertical projection of the filter portion on the substrate, and at least a portion of the first portion of the transition block is located in the third groove.

9. The display substrate according to claim 7, wherein the transition block is located in the third groove.

10. The display panel according to claim 7, wherein
the anode includes a main body portion and a connection portion connected to the main body portion;
the first planarization layer further has a plurality of second via holes, and the transition block is electrically connected to the source-drain electrode pattern through at least one second via hole; and
the second planarization layer further has a plurality of third via holes, and the connection portion is electrically connected to the transition block through at least one third via hole.

11. The display panel according to claim 1, wherein
the plurality of conductive patterns include at least the source-drain electrode patterns of thin film transistors;
the source-drain electrode patterns of the thin film transistors include a first source-drain electrode pattern, a vertical projection of a first source-drain electrode pattern on the substrate overlaps with a vertical projection of an anode on the substrate; the first source-drain electrode pattern includes a second portion, a vertical projection of the second portion on the substrate is located within the vertical projection of the anode on the substrate, and the second portion is located in a first groove.

12. The display panel according to claim 11, wherein
the first source-drain electrode pattern further includes a third portion, a vertical projection of the third portion on the substrate is located outside the vertical projection of the anode on the substrate, and the second portion and the third portion of the first source-drain electrode pattern are located in the first groove.

13. The display panel according to claim 11, wherein
the plurality of conductive patterns further include a plurality of voltage signal lines and a plurality of data signal lines; and
a portion, whose vertical projection on the substrate overlapping with a vertical projection of an anode on the substrate, of each of at least one of the plurality of voltage signal lines and the plurality of data signal lines is located in a first groove.

14. The display panel according to claim 11, wherein
the plurality of conductive patterns further include a plurality of voltage signal lines and a plurality of data signal lines; and
each of at least one of the plurality of voltage signal lines and the plurality of data signal lines is located in a first groove.

15. The display panel according to claim 11, further comprising:
an active layer disposed between the substrate and the first planarization layer and including active layer patterns of the thin film transistors;
a first gate conductive layer disposed between the active layer and the first planarization layer and including gate patterns of the thin film transistors; and
a second gate conductive layer disposed between the first gate conductive layer and the first planarization layer; a capacitor being composed of a portion of the second gate conductive layer and a portion of the first gate conductive layer; wherein
a surface of the first planarization layer proximate to the substrate is in direct contact with the second gate conductive layer.

16. A display apparatus comprising the display panel according to claim 1.

17. A method for manufacturing a display panel, comprising:
forming an insulating material film on a side of a substrate;
forming a plurality of first grooves in the insulating material film to form a first planarization layer;
forming a conductive pattern layer on a surface of the first planarization layer away from the substrate, wherein the conductive pattern layer includes a plurality of conductive patterns, at least a portion of a conductive pattern is located in a first groove, and a surface, away from the substrate, of the at least the portion of the conductive pattern located in the first groove is substantially flush with a portion, except the plurality of first grooves, of the surface of the first planarization layer away from the substrate;
forming a second planarization layer on a surface of the conductive pattern layer away from the substrate;
forming an anode layer on a surface of the second planarization layer away from the substrate; wherein the anode layer includes a plurality of anodes, a vertical projection of the at least the portion of the conductive pattern located in the first groove on the substrate overlaps with a vertical projection of an anode on the substrate; and forming a source-drain conductive layer disposed between the substrate and the first planarization layer and including at least one of a plurality of voltage signal lines, a plurality of data signal lines, and source-drain electrode patterns of thin film transistors; wherein the plurality of conductive patterns include a plurality of signal lines, at least a portion of a signal line is located in the first groove;

wherein the plurality of signal lines include at least one of a plurality of auxiliary data signal lines and a plurality of auxiliary voltage signal lines;

wherein the source-drain conductive layer includes at least the voltage signal lines;

the voltage signal lines extend in a first direction, and are arranged at intervals in a second direction;

the plurality of signal lines include the plurality of auxiliary voltage signal lines, an auxiliary voltage signal line is electrically connected to a voltage signal line; the plurality of auxiliary voltage signal lines include:

a plurality of first auxiliary voltage signal lines, the first auxiliary voltage signal lines extending in the first direction and being arranged at intervals in the second direction, and a first auxiliary voltage signal line being opposite to a voltage signal line; and a plurality of second auxiliary voltage signal lines, the second auxiliary voltage signal lines extending in the second direction and being arranged at intervals in the first direction, and the plurality of second auxiliary voltage signal lines being configured to electrically connect the plurality of first auxiliary voltage signal lines; wherein the first planarization layer further has a plurality of first via holes, the first auxiliary voltage signal line is electrically connected to the voltage signal line opposite thereto through at least one first via hole.

* * * * *